United States Patent
Sim et al.

(10) Patent No.: US 10,598,711 B2
(45) Date of Patent: Mar. 24, 2020

(54) ELECTROMAGNETIC WAVE REVERBERATION CHAMBER

(71) Applicant: Electronics and Telecommunications Research Institute, Daejeon (KR)

(72) Inventors: Dong-Uk Sim, Daejeon (KR); Sang il Kwak, Daejeon (KR); Jong Hwa Kwon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 190 days.

(21) Appl. No.: 15/717,407

(22) Filed: Sep. 27, 2017

(65) Prior Publication Data

US 2018/0231593 A1    Aug. 16, 2018

(30) Foreign Application Priority Data

Feb. 10, 2017   (KR) .......................... 10-2017-0018453

(51) Int. Cl.
*G01R 29/08*    (2006.01)
*H01Q 15/18*    (2006.01)

(52) U.S. Cl.
CPC ......... *G01R 29/0821* (2013.01); *H01Q 15/18* (2013.01)

(58) Field of Classification Search
CPC .............. G01R 29/0821; G01R 29/105; G01R 31/286; G10K 15/08; G01H 7/00
(Continued)

(56) References Cited

U.S. PATENT DOCUMENTS 3,120,641 A * 2/1964 Buckley ............... G01R 29/105
                                                            455/128
3,273,150 A * 9/1966 Emerson .............. G01R 29/105
                                                            342/4
(Continued)

FOREIGN PATENT DOCUMENTS

DE    102015118458 A1 *  5/2017 ............. G01R 31/00
EP      2669689 A1 * 12/2013 ........... H05K 9/0001
(Continued)

OTHER PUBLICATIONS

Roman et al., Reverberation Chamber Low Frequency Field Uniformity Improvement With Conducting Pyramidal Structures. South African Institute of Electrical Engineers vol. 103(4) Dec. 2012 (Year: 2012).*

(Continued)

*Primary Examiner* — Patrick Assouad
*Assistant Examiner* — Sean Curtis
(74) *Attorney, Agent, or Firm* — William Park & Associates Ltd.

(57) ABSTRACT

Disclosed is an electromagnetic wave reverberation chamber including a column-type mode stirrer including a plurality of plate-shaped electromagnetic wave reflectors connected by a metal column provided on a bottom of the electromagnetic wave reverberation chamber, a ceiling-type mode stirrer including a plurality of plate-shaped electromagnetic wave reflectors connected by a metal column provided on a wall surface of the electromagnetic wave reverberation chamber and disposed around a ceiling of the electromagnetic wave reverberation chamber, and a pyramidal mode stirrer including a plurality of pyramid-shaped electromagnetic wave reflectors and disposed on a wall surface of the electromagnetic wave reverberation chamber.

6 Claims, 17 Drawing Sheets

(58) Field of Classification Search
USPC .......... 324/627, 629; 455/67.11–67.14, 423; 73/571, 586; 84/630, 707; 381/63–64
See application file for complete search history.

(56) References Cited

U.S. PATENT DOCUMENTS

| | | | | |
|---|---|---|---|---|
| H821 H * | 9/1990 | Hatfield | | 324/627 |
| 5,532,704 A * | 7/1996 | Ruelle | | G01R 29/105 174/384 |
| 5,982,331 A * | 11/1999 | Podgorski | | G01R 29/0821 343/703 |
| 6,795,030 B2 * | 9/2004 | Klingler | | G01R 29/0821 324/627 |
| 6,885,265 B2 * | 4/2005 | Li | | G01R 31/001 333/227 |
| 7,122,772 B2 * | 10/2006 | Feher | | H05B 6/6402 219/697 |
| 7,286,961 B2 * | 10/2007 | Kildal | | G01R 29/0821 702/182 |
| 7,444,264 B2 * | 10/2008 | Kildal | | G01R 29/0821 343/703 |
| 8,462,039 B2 * | 6/2013 | Park | | H01Q 17/00 342/4 |
| 8,693,158 B2 * | 4/2014 | Chew | | G01R 29/0821 361/139 |
| 8,854,246 B1 * | 10/2014 | Opperman | | H01Q 17/008 342/1 |
| 9,035,817 B2 * | 5/2015 | Sim | | G01R 29/0821 342/1 |
| 9,258,067 B2 * | 2/2016 | Kildal | | G01R 29/0821 |
| 9,276,325 B2 * | 3/2016 | Sim | | H01Q 17/008 |
| 9,482,708 B2 * | 11/2016 | Alhorr | | G01R 27/32 |
| 9,746,423 B2 * | 8/2017 | Sayler | | G01R 29/0821 |
| 10,145,804 B2 * | 12/2018 | Sayler | | G01R 29/0821 |
| 2002/0160717 A1 | 10/2002 | Persson | | G01R 29/0821 455/67.11 |
| 2003/0184324 A1 * | 10/2003 | Klingler | | G01R 29/0821 324/702 |
| 2004/0183547 A1 * | 9/2004 | Kildal | | G01R 29/0821 324/627 |
| 2005/0206550 A1 * | 9/2005 | Moller | | G01R 29/0821 342/4 |
| 2006/0017630 A1 * | 1/2006 | Kildal | | G01R 29/0821 343/703 |
| 2009/0303141 A1 * | 12/2009 | Kosdikian | | G01R 29/0821 343/703 |
| 2010/0233969 A1 * | 9/2010 | Frolik | | H04B 17/0082 455/67.14 |
| 2011/0043222 A1 * | 2/2011 | Leferink | | G01R 29/0835 324/627 |
| 2011/0133977 A1 * | 6/2011 | Park | | H01Q 17/00 342/1 |
| 2012/0162001 A1 * | 6/2012 | Sim | | H01Q 17/008 342/4 |
| 2013/0050006 A1 * | 2/2013 | Sim | | H01Q 17/008 342/4 |
| 2013/0147650 A1 * | 6/2013 | Ho | | G01R 29/0821 342/4 |
| 2014/0141727 A1 * | 5/2014 | Kildal | | G01R 29/0821 455/67.12 |
| 2014/0210502 A1 * | 7/2014 | Alhorr | | G01R 29/0821 324/750.25 |
| 2015/0149108 A1 * | 5/2015 | Cozza | | G01R 29/0821 702/124 |
| 2017/0012714 A1 * | 1/2017 | Kildal | | H04B 17/102 |
| 2018/0231593 A1 * | 8/2018 | Sim | | G01R 29/0821 |

FOREIGN PATENT DOCUMENTS

| | | | | |
|---|---|---|---|---|
| JP | 01114099 A | * | 5/1989 | ......... G01R 29/105 |
| JP | 2004347439 A | | 12/2004 | |
| JP | 2014228337 A | | 12/2014 | |
| KR | 20130020983 A | | 3/2013 | |
| KR | 1020130020983 A | | 3/2013 | |
| KR | 101548240 B1 | | 8/2015 | |
| WO | WO-2012171562 A1 | * | 12/2012 | ......... G01R 29/105 |
| WO | WO-2013175263 A1 | * | 11/2013 | ......... G01R 29/0892 |
| WO | WO-2013179016 A1 | * | 12/2013 | ......... H05K 9/0003 |

OTHER PUBLICATIONS

Wayback date of Reverberation (Mode-Stirred) Chambers for Electromagnetic Compatibility reference (Year: 2019).*
Dawson et al., Reverberation (Mode-Stirred) Chambers for Electromagnetic Compatibility. Aug. 2004 (Year: 2004).*
Bruns et al., A Closer Look at Reverberation Chambers—3-D Simulation and Experimental Verification. IEEE Transactions on Electromagnetic Compatibility, vol. 47, No. 3, Aug. 2005. (Year: 2005).*
JMCatala, EM Modeling of Mode Stirrers in Microwave Applicators, Scientific and Industrial Microwaves in ITACA. 2011. (Year: 2011).*
International Electrotechnical Commission (IEC), Electromagnetic compatibility (EMC)—Part 4-21: Testing and measurement techniques—Reverberation chamber test methods, IEC 61000-4-21, Jan. 2011, 228, International Electrotechnical Commission, Geneva, Switzerland.

* cited by examiner

ELECTROMAGNETIC WAVE REVERBERATION CHAMBER

CROSS-REFERENCE TO RELATED APPLICATION

This application claims the priority benefit of Korean Patent Application No. 10-2017-0018453 filed on Feb. 10, 2017, in the Korean Intellectual Property Office, the disclosure of which is incorporated herein by reference.

BACKGROUND

1. Field

Example embodiments of the following description relate to an electromagnetic wave reverberation chamber, and more particularly, to an electromagnetic wave reverberation chamber with performance improved by increasing an eigenmode shift by using a mode stirrer.

2. Description of Related Art

Along with the development of information technology (IT), use of electronic devices using wireless communication has surged in various frequency bands. Due to such an increase in use of wireless communication, scopes of related regulations on, for example, an electromagnetic interference (EMI) and a radiated immunity (RI), have also been expanded, compared to the past.

That is, measuring an accurate EMI and an RI with respect to an electronic device providing various services may be required. An existing anechonic chamber, which occupies a relatively large space and is produced at a great cost, was used for such a measurement.

The National Institute of Standards and Technology (NIST) published a result of research on an electromagnetic wave reverberation chamber, which may be used as a substitute testing facility for measuring an EMI and an RI. In addition, the International Special Committee on Radio Interference (CISPR) stipulated specifications of an electromagnetic wave reverberation chamber in the International Electrotechnical Commission (IEC) 61000-4-21.

For such an electromagnetic wave reverberation chamber, securing electromagnetic wave uniformity may be important, and thus research on such may be needed.

SUMMARY

An aspect provides various structures of an electromagnetic wave reverberation chamber to secure electromagnetic wave uniformity.

Another aspect provides a method of increasing an eigenmode shift in an electromagnetic wave reverberation chamber.

Still another aspect provides an electromagnetic wave reverberation chamber with electromagnetic wave uniformity that is improved by a low standard deviation in electromagnetic field inside the electromagnetic wave reverberation chamber.

According to an aspect, there is provided an electromagnetic wave reverberation chamber including a column-type mode stirrer including a plurality of plate-shaped electromagnetic wave reflectors connected by a metal column provided on a bottom of the electromagnetic wave reverberation chamber, a ceiling-type mode stirrer including a plurality of plate-shaped electromagnetic wave reflectors connected by a metal column provided on a wall surface of the electromagnetic wave reverberation chamber, and disposed around a ceiling of the electromagnetic wave reverberation chamber, and a pyramidal mode stirrer including a plurality of pyramid-shaped electromagnetic wave reflectors and disposed on a wall surface of the electromagnetic wave reverberation chamber.

An eigenmode of the electromagnetic wave reverberation chamber may be changed by the column-type mode stirrer, the ceiling-type mode stirrer, and the pyramidal mode stirrer.

The electromagnetic wave reverberation chamber may further include a concavo-convex mode stirrer including an electromagnetic wave reflector disposed in a concavo-convex form, and disposed on another wall surface different from the wall surface on which the pyramidal mode stirrer is disposed.

The concavo-convex mode stirrer may be provided as a plurality of concavo-convex mode stirrers disposed parallel to the wall surface.

The eigenmode of the electromagnetic wave reverberation chamber may be changed by adjusting a width, a length, and a height of the concavo-convex mode stirrer, and a number of the concavo-convex mode stirrers provided as the concavo-convex mode stirrer.

The plurality of plate-shaped electromagnetic wave reflectors of each of the column-type mode stirrer and the ceiling-type mode stirrer may be combined to form a preset shape.

A size of each of the plurality of plate-shaped electromagnetic wave reflectors may be determined to be a preset value.

A gap between the plurality of plate-shaped electromagnetic wave reflectors may be determined to be a preset value.

According to another aspect, there is provided an electromagnetic wave reverberation chamber including a column-type mode stirrer including a plurality of plate-shaped electromagnetic wave reflectors connected by a metal column provided on a bottom of the electromagnetic wave reverberation chamber, and a ceiling-type mode stirrer including a plurality of plate-shaped electromagnetic wave reflectors connected by a metal column provided on a wall surface of the electromagnetic wave reverberation chamber, and disposed around a ceiling of the electromagnetic wave reverberation chamber.

According to still another aspect, there is provided an electromagnetic wave reverberation chamber including a column-type mode stirrer including a plurality of plate-shaped electromagnetic wave reflectors connected by a metal column provided on a bottom of the electromagnetic wave reverberation chamber, and a pyramidal mode stirrer including a plurality of pyramid-shaped electromagnetic wave reflectors and disposed on a wall surface of the electromagnetic wave reverberation chamber.

According to yet another aspect, there is provided an electromagnetic wave reverberation chamber including a ceiling-type mode stirrer including a plurality of plate-shaped electromagnetic wave reflectors connected by a metal column provided on a wall surface of the electromagnetic wave reverberation chamber, and disposed around a ceiling of the electromagnetic wave reverberation chamber, and a pyramidal mode stirrer including a plurality of pyramid-shaped electromagnetic wave reflectors and disposed on a wall surface of the electromagnetic wave reverberation chamber.

Additional aspects of example embodiments will be set forth in part in the description which follows and, in part, will be apparent from the description, or may be learned by practice of the disclosure.

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION

Figure 1:
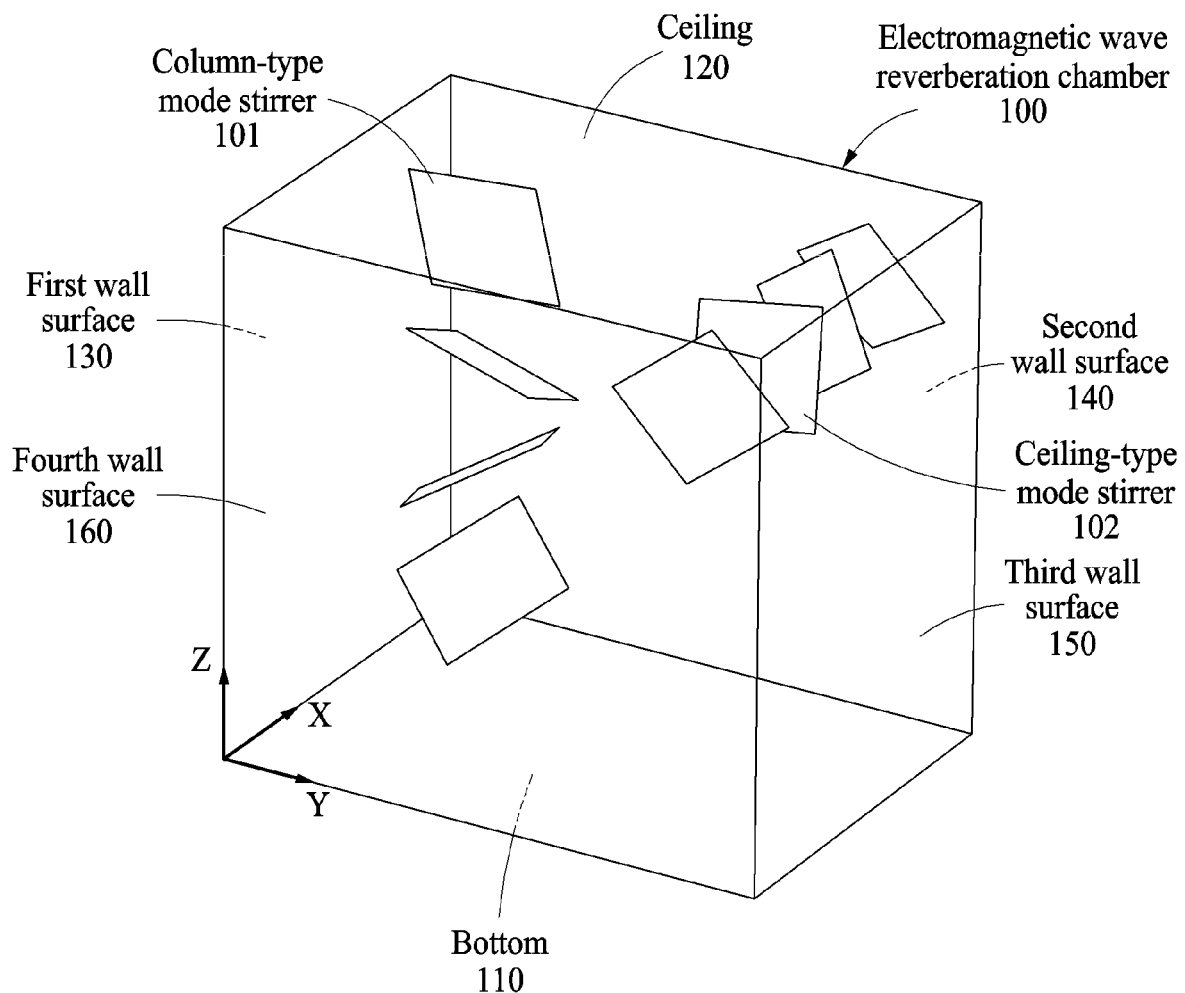
FIG. 1 is a diagram illustrating a structure of an electromagnetic wave reverberation chamber according to an example embodiment.

Hereinafter, some example embodiments will be described in detail with reference to the accompanying drawings. Regarding the reference numerals assigned to the elements in the drawings, it should be noted that the same elements will be designated by the same reference numerals, wherever possible, even though they are shown in different drawings. Also, in the description of embodiments, detailed description of well-known related structures or functions will be omitted when it is deemed that such description will cause ambiguous interpretation of the present disclosure.

It should be understood, however, that there is no intent to limit this disclosure to the particular example embodiments disclosed. On the contrary, example embodiments are to cover all modifications, equivalents, and alternatives falling within the scope of the example embodiments.

Terms such as first, second, A, B, (a), (b), and the like may be used herein to describe components. Each of these terminologies is not used to define an essence, order or sequence of a corresponding component but used merely to distinguish the corresponding component from other component(s). For example, a first component may be referred to a second component, and similarly the second component may also be referred to as the first component.

It should be noted that if it is described in the specification that one component is "connected," "coupled," or "joined" to another component, a third component may be "connected," "coupled," and "joined" between the first and second components, although the first component may be directly connected, coupled or joined to the second component. In addition, it should be noted that if it is described herein that one component is "directly connected" or "directly joined" to another component, a third component may not be present therebetween. Likewise, expressions, for example, "between" and "immediately between" and "adjacent to" and "immediately adjacent to" may also be construed as described in the foregoing.

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms, including technical and scientific terms, used herein have the same meaning as commonly understood by one of ordinary skill in the art to which this disclosure pertains based on an understanding of the present disclosure. Terms, such as those defined in commonly used dictionaries, are to be interpreted as having a meaning that is consistent with their meaning in the context of the relevant art and the present disclosure, and are not to be interpreted in an idealized or overly formal sense unless expressly so defined herein.

Hereinafter, example embodiments are described in detail with reference to the accompanying drawings. Like reference numerals in the drawings denote like elements, and a known function or configuration will be omitted herein.

FIG. 1 is a diagram illustrating a structure of an electromagnetic wave reverberation chamber according to an example embodiment.

An electromagnetic wave reverberation chamber refers to a substitute testing facility used to measure an electromagnetic compatibility (EMC) including, for example, an electromagnetic interference (EMI) and a radiation immunity (RI), and a multiple-input multiple-output (MIMO) antenna performance, in an actual radio environment in addition to an existing anechoic chamber. To be used as such a substitute testing facility, the electromagnetic wave reverberation chamber may need to maintain electromagnetic wave uniformity to be greater than or equal to a specific value in an internal area in accordance with relevant international standards. Here, a greater eigenmode shift of the electromagnetic wave reverberation chamber may improve the electromagnetic wave uniformity. The eigenmode refers to a fundamental resonant mode in a resonator structure such as a waveguide and a cavity.

Increasing an eigenmode shift indicates lowering a standard deviation in electromagnetic field measured inside the electromagnetic wave reverberation chamber. A rectangular parallelepiped-shaped working volume in which a target to be measured is to be located may be defined in the electromagnetic wave reverberation chamber, and a standard deviation of electromagnetic fields measured at eight vertices of the working volume may be used as a measure of performance of the electromagnetic wave reverberation chamber. In detail, a strand deviation in electromagnetic field that satisfies a basic performance of the electromagnetic wave reverberation chamber may require less than or equal to 3 decibels in most frequency ranges. Thus, an external structure of the electromagnetic wave reverberation chamber and a mode stirrer in the electromagnetic wave reverberation chamber may need to be designed to increase an eigenmode shift and lower a standard deviation of measured electromagnetic fields, in order to provide the electromagnetic wave reverberation chamber having improved performance.

Referring to FIG. 1, an electromagnetic wave reverberation chamber 100 has an external structure provided in various polyhedral forms. For example, the external structure of the electromagnetic wave reverberation chamber 100 is provided in a form of a rectangular parallelepiped. In detail, the rectangular parallelepiped is represented by a bottom 110, a ceiling 120, a first wall surface 130, a second wall surface 140, a third wall surface 150, and a fourth wall surface 160.

The electromagnetic wave reverberation chamber 100 may include therein at least one mode stirrer to improve electromagnetic wave uniformity. Here, the mode stirrer may include at least one of a column-type mode stirrer, for example, a column-type mode stirrer 101 as illustrated, a ceiling-type mode stirrer, for example, a ceiling-type mode stirrer 102 as illustrated, a pyramidal mode stirrer, or a concavo-convex mode stirrer.

The mode stirrer may reflect an electromagnetic wave. Here, based on a type of the mode stirrer, the mode stirrer may reflect an electromagnetic wave while being fixed. Alternatively, based on a type of the mode stirrer, the mode stirrer may reflect an electromagnetic wave while rotating. For example, the column-type mode stirrer 101 and the ceiling-type mode stirrer 102 may reflect an electromagnetic wave while rotating, whereas the pyramidal mode stirrer and the concavo-convex mode stirrer may reflect an electromagnetic wave while being fixed. However, examples are not limited to the example described in the foregoing, and various examples may be applied to reflect an electromagnetic wave.

The mode stirrer may include a plurality of electromagnetic wave reflectors indicating various structures. An electromagnetic wave reflector may be formed of a material such as metal that reflects an electromagnetic wave, and reflect an incident electromagnetic wave at various angles. For example, the electromagnetic wave reflector may be a panel formed of metal, and the panel may reflect an incident electromagnetic wave to be transmitted to the mode stirrer.

The electromagnetic wave reflector may be formed in various structures. The various structures may include, for example, a plate shape and a pyramidal shape to reflect an electromagnetic wave at various angles. However, examples are not limited to the example structure shapes described in the foregoing.

As illustrated in FIG. 1, panels included in each of the column-type mode stirrer 101 and the ceiling-type mode stirrer 102 of the electromagnetic wave reverberation chamber 100 may be disposed by being bent at different angles. Also, distances between centers of the panels may be equal to or different from each other. In addition, sizes of the panels may be equal to or different from each other.

Here, physical parameters including, for example, a number of mode stirrers, and a shape, a size, and an installation location of the mode stirrer may be determined in an optimization process to increase an eigenmode shift of the electromagnetic wave reverberation chamber 100. Also, physical parameters such as a size, a shape, and an installation location of an electromagnetic wave reflector, and a gap between electromagnetic wave reflectors included in the mode stirrer may be determined based on the same principle described in the foregoing.

A physical parameter such as an installation location of the mode stirrer may be important to improve performance of the electromagnetic wave reverberation chamber 100. For example, locations at which the column-type mode stirrer 101 and the ceiling-type mode stirrer 102 are to be installed may be determined to improve the electromagnetic wave uniformity.

A physical parameter such as a number of mode stirrers may also be important to improve performance of the electromagnetic wave reverberation chamber 100. For example, at least one column-type mode stirrer and at least one ceiling-type mode stirrer may be installed as the column-type mode stirrer 101 and the ceiling-type mode stirrer 102, respectively.

A physical parameter such as a size of a panel included in the mode stirrer may also be important to improve performance of the electromagnetic wave reverberation chamber 100. For example, sizes of panels included in each of the column-type mode stirrer 101 and the ceiling-type mode stirrer 102 may be equal to or different from each other.

The mode stirrer may be formed in various structures. For example, the column-type mode stirrer 101 and the ceiling-type mode stirrer 102 may be formed in various structures, in addition to a Z-shaped structure. That is, the column-type mode stirrer 101 and the ceiling-type mode stirrer 102 may be provided in various structures based on a bending degree, a bending direction, a bending inclination, and a bending angle of panels included in each of the column-type mode stirrer 101 and the ceiling-type mode stirrer 102. For example, a size of the concavo-convex mode stirrer including a plurality of panels may be adjusted based on a size of the electromagnetic wave reverberation chamber 100, and the concavo-convex mode stirrer may be provided on a wall surface of the electromagnetic wave reverberation chamber 100. Here, the panels included in the concavo-convex mode stirrer may be a type of an electromagnetic wave reflector, and a shape of a panel may be provided in various shapes in addition to a plate shape.

An interior of the electromagnetic wave reverberation chamber 100 may be formed of metal to reflect an electromagnetic wave. In addition, the panels of the column-type mode stirrer 101 and the ceiling-type mode stirrer 102 may also be formed of metal. Further, a column passing through the panels, which supports the mode stirrer, may also be formed of metal. However, a metal column connecting a column-type mode stirrer and a ceiling-type mode stirrer will be omitted in the drawings to clarify an internal structure of an electromagnetic wave reverberation chamber.

Figure 2:
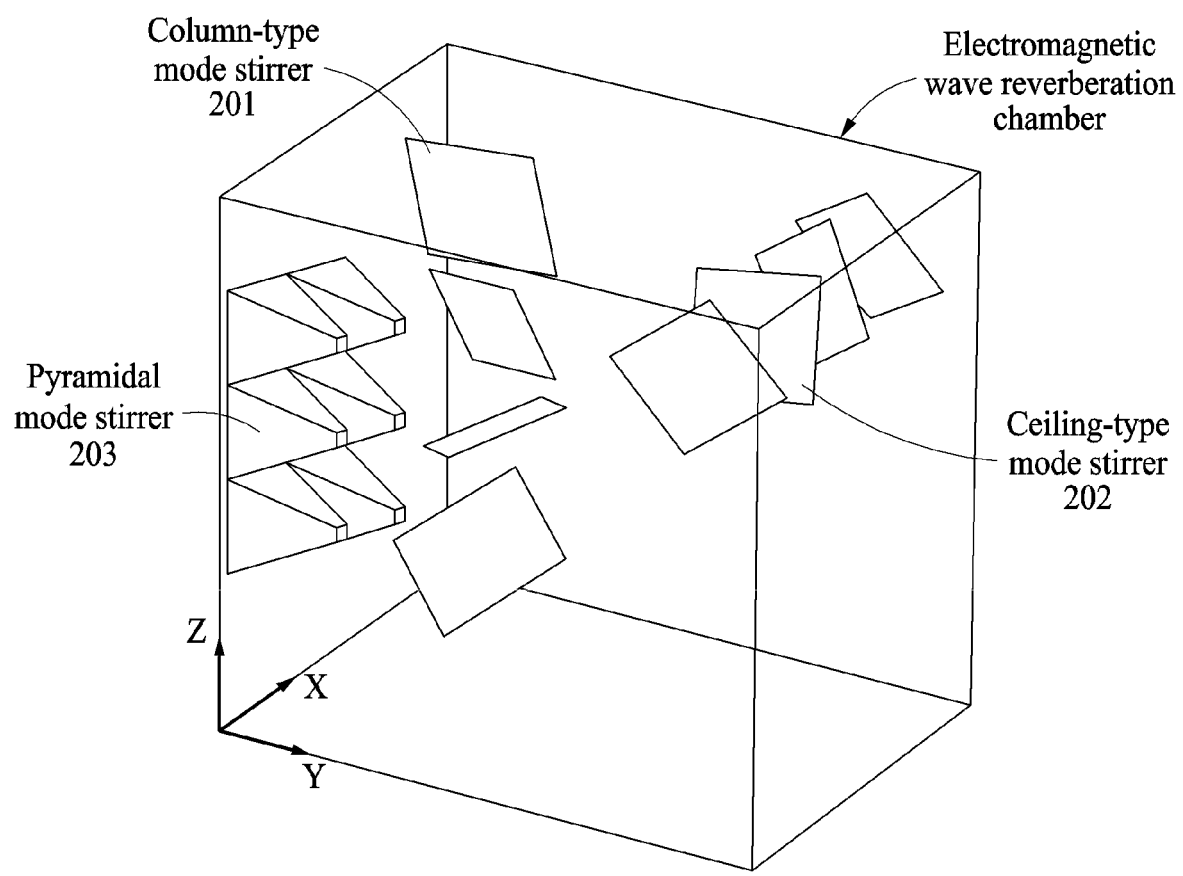
FIG. 2 is a diagram illustrating a structure of an electromagnetic wave reverberation chamber according to a first example embodiment.

FIG. 2 is a diagram illustrating a structure of an electromagnetic wave reverberation chamber according to a first example embodiment.

Referring to FIG. 2, an electromagnetic wave reverberation chamber includes a pyramidal mode stirrer 203 disposed on a wall surface of the electromagnetic wave reverberation chamber. The pyramidal mode stirrer 203 may include electromagnetic wave reflectors each provided in a pyramid shape. The pyramidal mode stirrer 203 may reflect an electromagnetic wave in the electromagnetic wave reverberation chamber. Thus, by adjusting such an electromagnetic wave reflection characteristic of the electromagnetic wave reverberation chamber, an eigenmode shift may increase. Thus, by reducing a standard deviation in electromagnetic field and improving electromagnetic wave uniformity, performance of the electromagnetic wave reverberation chamber may be improved.

The eigenmode of the electromagnetic wave reverberation chamber may be changed greatly based on a size and an installation location of the pyramidal mode stirrer 203, and a number of pyramidal mode stirrers. Such an eigenmode shift may reduce a standard deviation in electromagnetic field of a working volume of the electromagnetic wave reverberation chamber and improve performance of the electromagnetic wave reverberation chamber. Thus, the size and the installation location of the pyramidal mode stirrer 203 and the number of pyramidal mode stirrers may be determined to maximize the performance of the electromagnetic wave reverberation chamber. An electromagnetic wave reflector included in the pyramidal mode stirrer 203 may be formed using a metal panel. The pyramid shape of the pyramidal mode stirrer 203 may be used to reflect an electromagnetic wave, and a number of pyramids may be determined in an optimization process in consideration of other elements or components configured to reflect an electromagnetic wave.

The pyramidal mode stirrer 203 may be provided on one wall surface of the electromagnetic wave reverberation chamber. For example, compared to a column-type mode stirrer and a ceiling-type mode stirrer configured to reflect an electromagnetic wave while rotating, the pyramidal mode stirrer 203 may reflect an electromagnetic wave while being fixed to the wall surface of the electromagnetic wave reverberation chamber.

Figure 3:
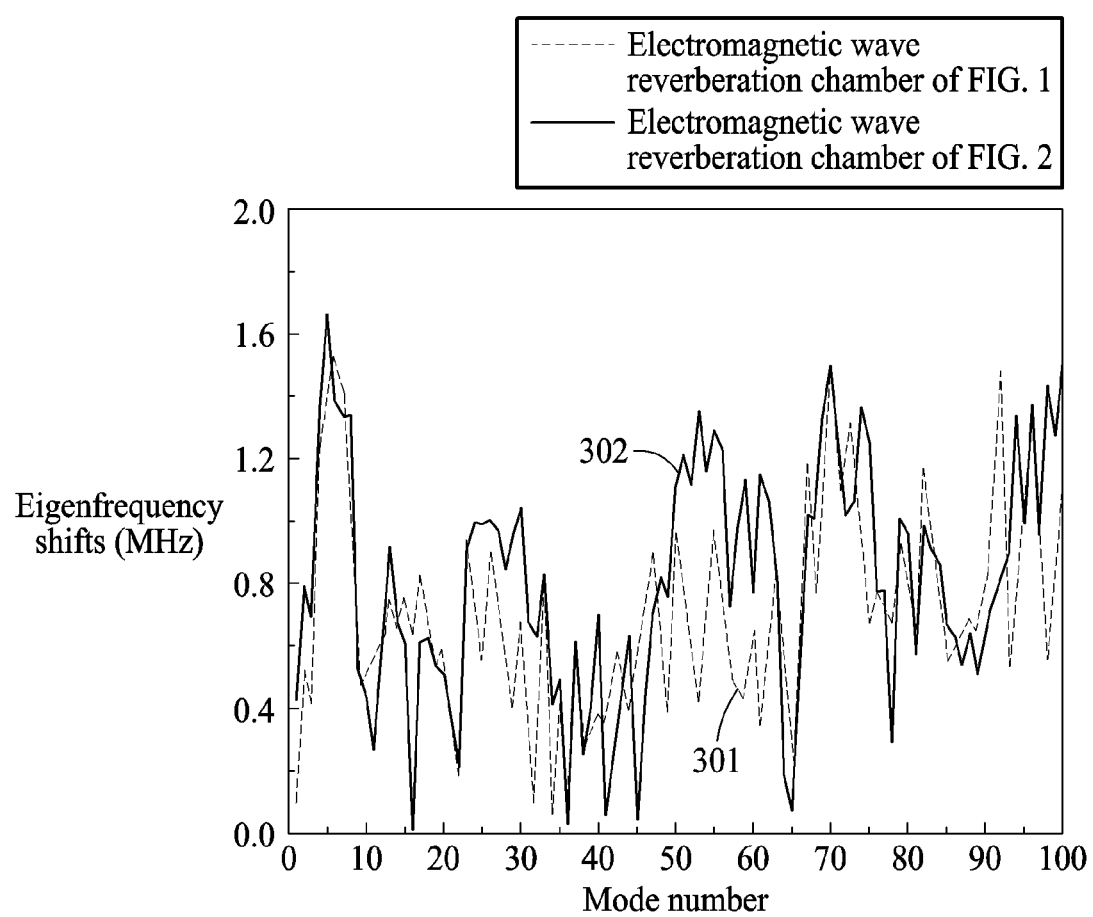
FIG. 3 is a diagram illustrating eigenfrequency shifts calculated through a numerical analysis of the electromagnetic wave reverberation chamber illustrated in FIG. 2 according to the first example embodiment.

FIG. 3 is a diagram illustrating an eigenfrequency shift calculated through a numerical analysis of the electromagnetic wave reverberation chamber illustrated in FIG. 2 according to the first example embodiment.

FIG. 3 is provided as an example selected to demonstrate an effect of the present disclosure. An eigenmode shift is indicated by an eigenfrequency shift in FIG. 3. Here, an eigenfrequency refers to a frequency at which an eigenmode, a basic resonant mode in a resonator structure such as a waveguide and a cavity, is generated. Referring to FIG. 3, a graph 301 illustrates eigenfrequency shifts of the electromagnetic wave reverberation chamber 100 illustrated in FIG. 1, and a graph 302 illustrates eigenfrequency shifts of the electromagnetic wave reverberation chamber illustrated in FIG. 2. That is, the graph 301 illustrates shifts in eigenfrequency shown in a case in which the electromagnetic wave reverberation chamber 100 includes therein the column-type mode stirrer 101 and the ceiling-type mode stirrer 102, compared to a case in which an electromagnetic wave reverberation chamber is empty. In addition, the graph 302 illustrates shifts in eigenfrequency shown in a case in which the electromagnetic wave reverberation chamber includes therein the column-type mode stirrer 201, the ceiling-type mode stirrer 202, and the pyramidal mode stirrer 203, compared to the case in which the electromagnetic wave reverberation chamber is empty.

As illustrated, in most mode numbers, the electromagnetic wave reverberation chamber illustrated in FIG. 2 has greater eigenfrequency shifts, compared to the electromagnetic wave reverberation chamber 100 illustrated in FIG. 1. Here, a mode number refers to an order of an eigenmode in which an eigenfrequency is generated. In addition, results in mode numbers 1 through 10 may show performance of an electromagnetic wave reverberation chamber at a lowest useable frequency (LUF). The LUF refers to a frequency in eigenmode number 1. That is, the electromagnetic wave reverberation chamber illustrated in FIG. 2 may have an increased eigenfrequency shift at the LUF. Thus, compared to the electromagnetic wave reverberation chamber 100 illustrated in FIG. 1, the electromagnetic wave reverberation chamber including the pyramidal mode stirrer 203, which is illustrated in FIG. 2, may have improved performance because a standard deviation in electromagnetic field of a working volume of the electromagnetic wave reverberation chamber is reduced and electromagnetic wave uniformity is improved.

Here, a size of the electromagnetic wave reverberation chamber 100 illustrated in FIG. 1, which is selected to demonstrate the effect, is 1.4 meters (m)×1.95 m×1.85 m, in which a size of a panel of the column-type mode stirrer 101 is 0.46 m in width×0.46 m in length and a size of a panel of the ceiling-type mode stirrer 102 is 0.40 m in width×0.40 m in length.

Figure 4:
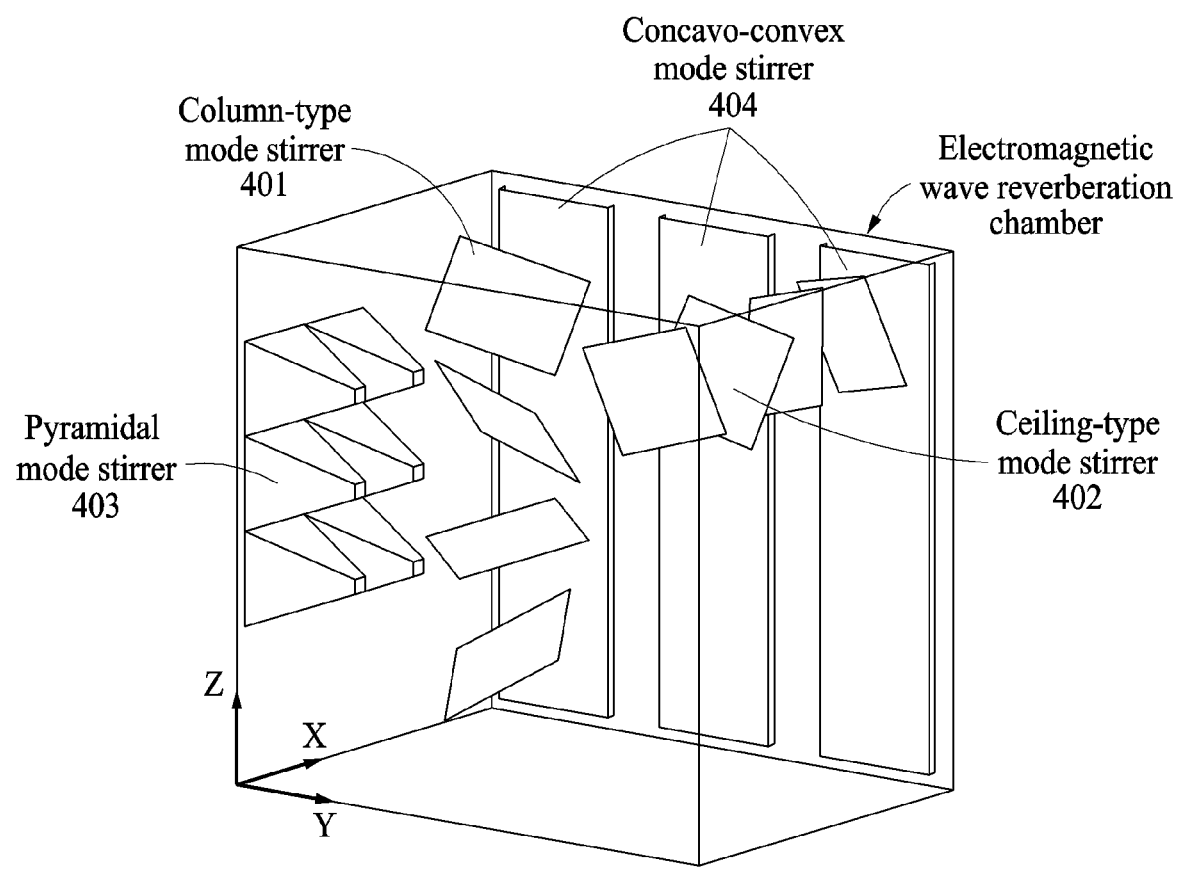
FIG. 4 is a diagram illustrating a structure of an electromagnetic wave reverberation chamber according to a second example embodiment.

FIG. 4 is a diagram illustrating a structure of an electromagnetic wave reverberation chamber according to a second example embodiment.

Referring to FIG. 4, a column-type mode stirrer 401, a ceiling-type mode stirrer 402, and a pyramidal mode stirrer 403 are disposed as described with reference to FIG. 2. In addition, a concavo-convex mode stirrer 404 is disposed on a wall surface of an electromagnetic wave reverberation chamber. Here, the wall surface may be different from a wall surface on which the pyramidal mode stirrer 403 is disposed.

For example, the column-type mode stirrer 401 and the ceiling-type mode stirrer 402 may reflect an electromagnetic wave while rotating, whereas the pyramidal mode stirrer 403 and the concavo-convex mode stirrer 404 may reflect an electromagnetic wave while being fixed in the electromagnetic wave reverberation chamber. However, examples are not limited to the example described in the foregoing, and various examples may be applied.

An eigenmode shift of the electromagnetic wave reverberation chamber may be greatly affected by settings of physical parameters such as a number of concavo-convex mode stirrers, and an installation location, a width, a height, and a length of the concavo-convex mode stirrer 404, and a gap between the concavo-convex mode stirrers. In addition, such parameters as a width, a height, a length, and an installation location of an electromagnetic wave reflector included in the concavo-convex mode stirrer 404, and a gap between electromagnetic wave reflectors and a number of the electromagnetic wave reflectors may also affect the eigenmode shift. For example, a width, an installation location, a height, and a length of a panel, which is a type of the electromagnetic wave reflector included in the concavo-convex mode stirrer 404, and a number of panels and a gap between the panels may be determined in an optimization process. For example, as illustrated, three panels of the concavo-convex mode stirrer 404 may be determined in the optimization process for optimizing physical parameters such as a width, a length, a height, and the like of each panel. Here, the concavo-convex mode stirrer 404 may be disposed parallel to a y axis.

Figure 5:
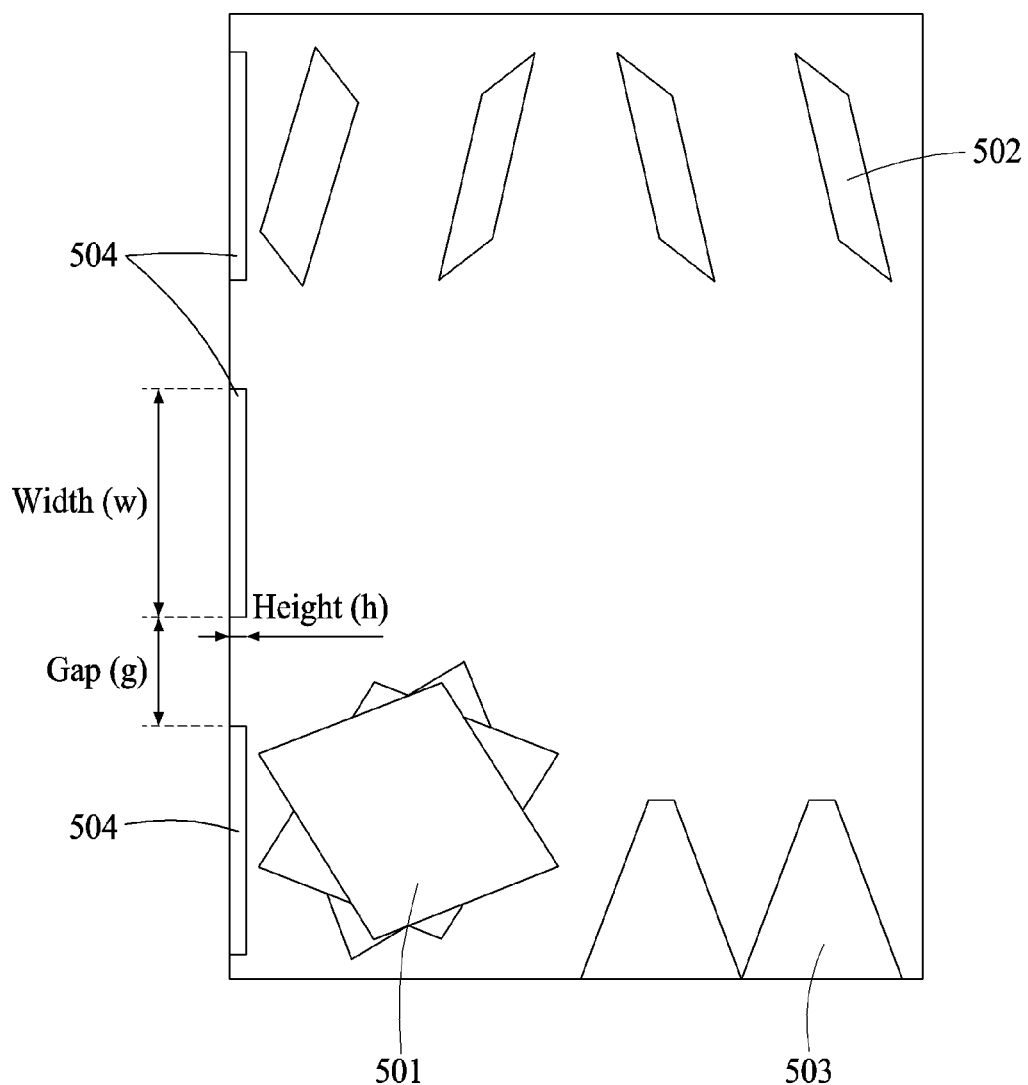
FIG. 5 is a planar view of the electromagnetic wave reverberation chamber illustrated in FIG. 4 according to the second example embodiment.

FIG. 5 is a planar view of the electromagnetic wave reverberation chamber illustrated in FIG. 4 according to the second example embodiment.

FIG. 5 is a planar view obtained by observing, from a ceiling, a column-type mode stirrer 501, a ceiling-type mode stirrer 502, a pyramidal mode stirrer 503, and a concavo-convex mode stirrer 504, for a better understanding of a structure of a mode stirrer.

Here, a width w and a height h of the concavo-convex mode stirrer 504, a gap g between concavo-convex mode stirrers, and a number of the concavo-convex mode stirrers are physical parameters determined in an optimization process to improve electromagnetic wave uniformity. For example, the electromagnetic wave uniformity may be determined based on the width w of the concavo-convex mode stirrer 504. In addition, the electromagnetic wave uniformity may also be determined based on the gap g between the concavo-convex mode stirrers provided as the concavo-convex mode stirrer 504. Further, the electromagnetic wave uniformity may also be determined based on the height h of the concavo-convex mode stirrer 504.

Here, in a case in which the physical parameters associated with the concavo-convex mode stirrer 504, for example, the width w, the height h, the gap g, and the number, are erroneously set, a standard deviation in electromagnetic field in the electromagnetic wave reverberation chamber may increase. Thus, the physical parameters may be set to generate many eigenmodes at an LUF or higher of the electromagnetic wave reverberation chamber. Thus, by increasing an eigenmode shift at the LUF or higher, the electromagnetic wave reverberation chamber may have improved performance at the LUF or higher.

Figure 6:
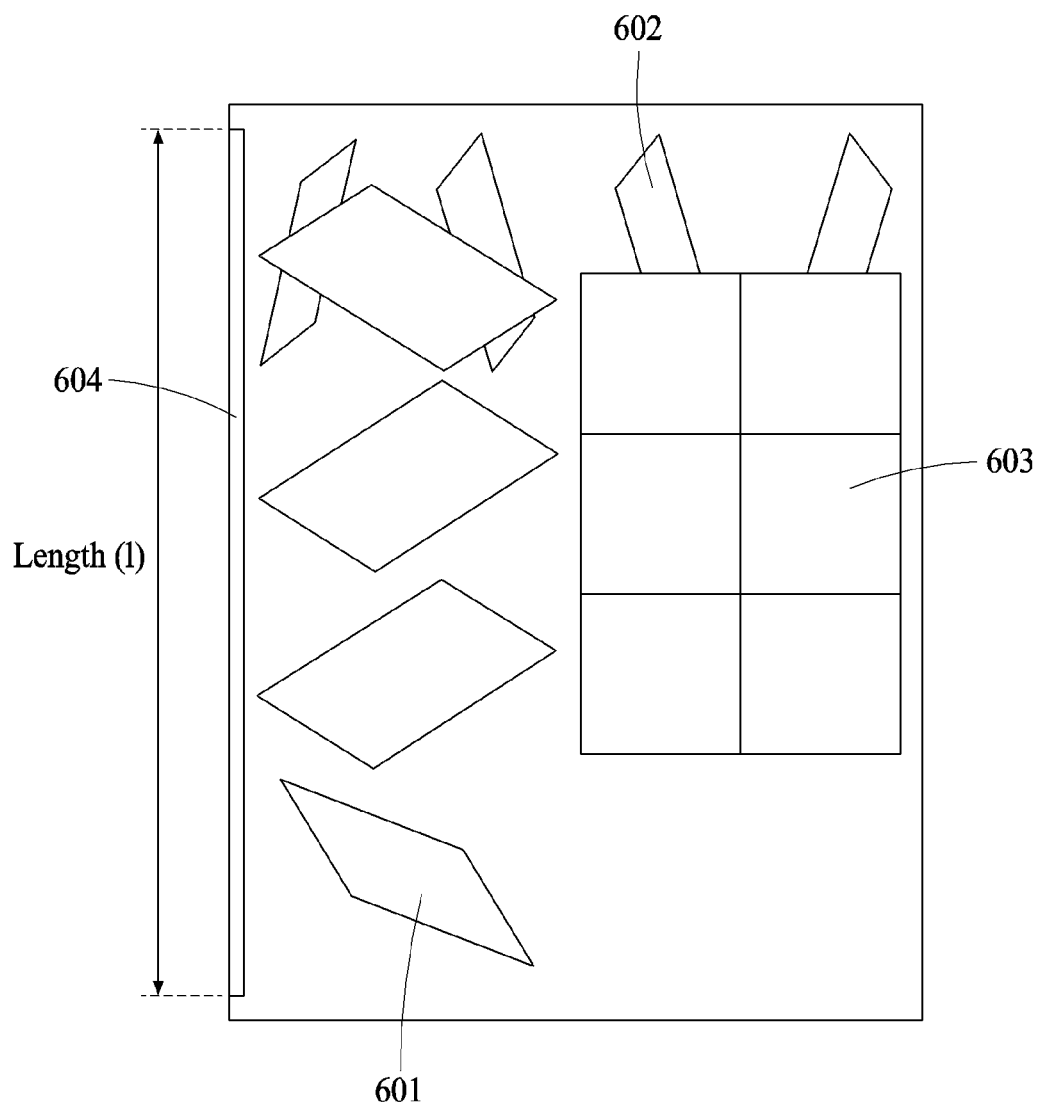
FIG. 6 is a side view of the electromagnetic wave reverberation chamber illustrated in FIG. 4 according to the second example embodiment.

FIG. 6 is a side view of the electromagnetic wave reverberation chamber illustrated in FIG. 4 according to the second example embodiment.

FIG. 6 is a side view obtained by observing, from a first wall surface, a column-type mode stirrer 601, a ceiling-type mode stirrer 602, a pyramidal mode stirrer 603, and a concavo-convex mode stirrer 604, for a better understanding of a structure of a mode stirrer.

A physical parameter such as a length l of the concavo-convex mode stirrer 604 may be important to improve electromagnetic wave uniformity. For example, as illustrated, a standard deviation in electromagnetic field in the electromagnetic wave reverberation chamber may be determined based on the length l of the concavo-convex mode stirrer 604, and the electromagnetic wave uniformity may be determined accordingly.

However, in a case in which the physical parameter such as the length l of the concavo-convex mode stirrer 604 is erroneously set, the standard deviation in electromagnetic field in the electromagnetic wave reverberation chamber may increase greatly. Thus, the physical parameter may need to be set to generate numerous eigenmodes at an LUF or higher of the electromagnetic wave reverberation chamber.

Figure 7:
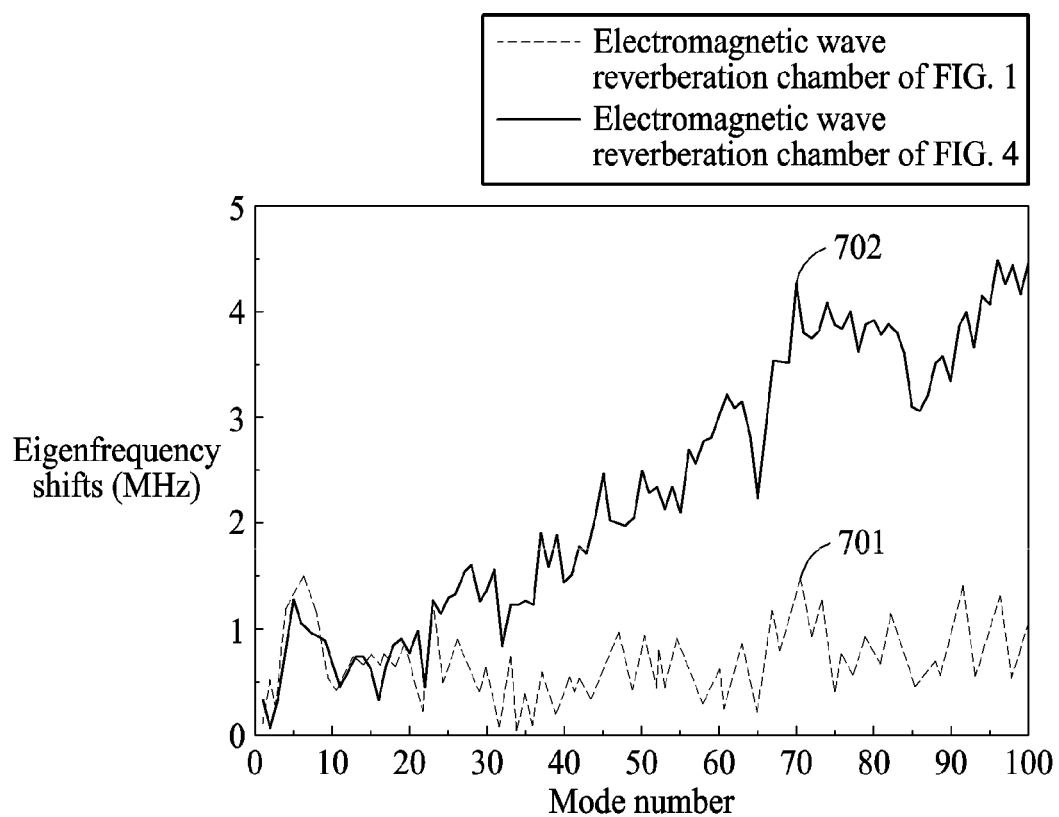
FIG. 7 is a diagram illustrating a comparison between eigenfrequency shifts calculated through a numerical analysis of the electromagnetic wave reverberation chamber illustrated in FIG. 4 according to the second example embodiment, and eigenfrequency shifts calculated through a numerical analysis of the electromagnetic wave reverberation chamber illustrated in FIG. 1.

FIG. 7 is a diagram illustrating a comparison between eigenfrequency shifts calculated through a numerical analysis of the electromagnetic wave reverberation chamber illustrated in FIG. 4 according to the second example embodiment, and eigenfrequency shifts calculated through a numerical analysis of the electromagnetic wave reverberation chamber 100 illustrated in FIG. 1.

In FIG. 7, the electromagnetic wave reverberation chamber 100 of FIG. 1 is illustrated as a target for a comparison to the electromagnetic wave reverberation chamber of FIG. 4 to indicate improved performance of the electromagnetic wave reverberation chamber of FIG. 4. A graph 701 illustrates eigenfrequency shifts of the electromagnetic wave reverberation chamber 100 illustrated in FIG. 1. That is, the graph 701 illustrates shifts in eigenfrequency shown in a case in which the electromagnetic wave reverberation chamber 100 includes therein the column-type mode stirrer 101 and the ceiling-type mode stirrer 102, compared to a case in which an electromagnetic wave reverberation chamber is empty. A graph 702 illustrates eigenfrequency shifts of the electromagnetic wave reverberation chamber illustrated in FIG. 4. That is, the graph 702 illustrates shifts in eigenfrequency shown in a case in which the electromagnetic wave reverberation chamber includes therein the column-type mode stirrer 401, the ceiling-type mode stirrer 402, the pyramidal mode stirrer 403, and the concavo-convex mode stirrer 404, compared to the case in which the electromagnetic wave reverberation chamber is empty.

That is, an additional installation of a concavo-convex mode stirrer with appropriately set physical parameters may greatly increase, in most mode numbers, eigenfrequency shifts of an electromagnetic wave reverberation chamber.

Figure 8:
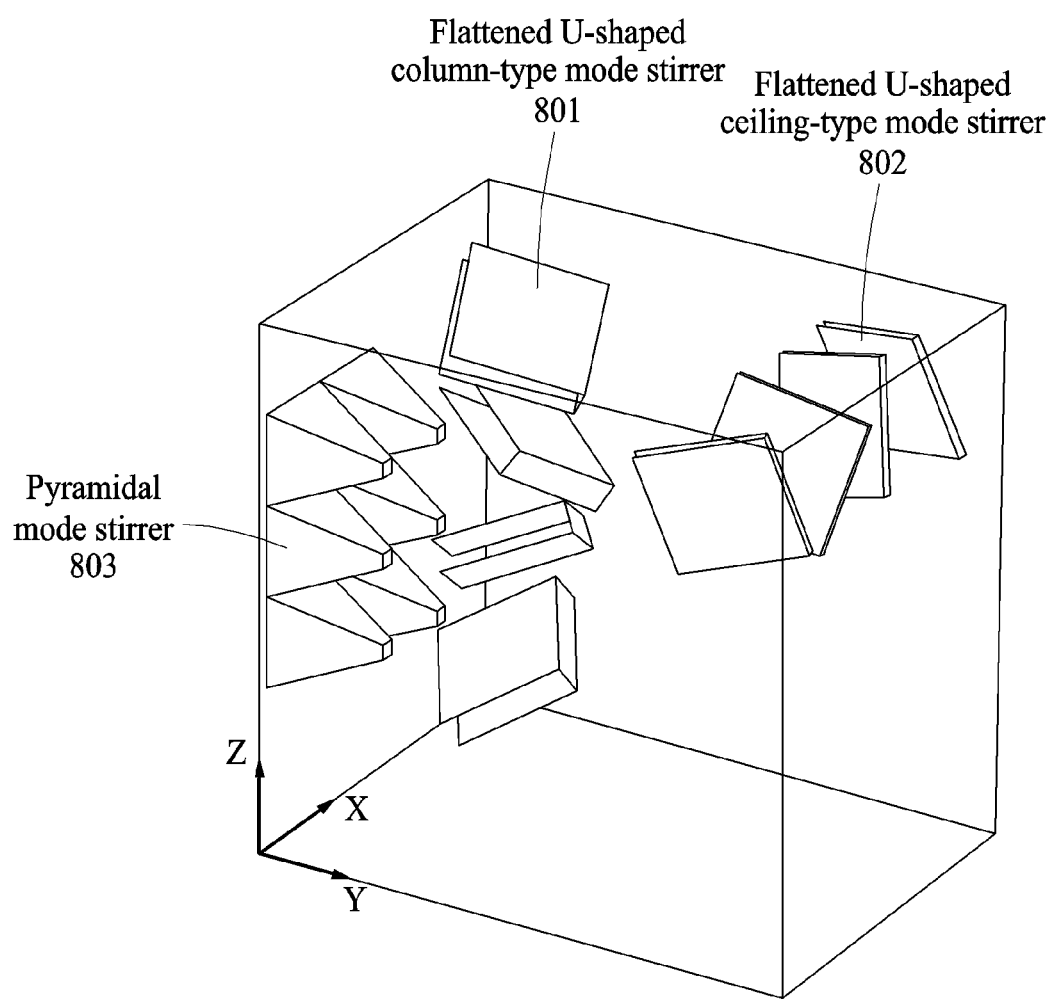
FIG. 8 is a diagram illustrating a structure of an electromagnetic wave reverberation chamber according to a third example embodiment.

FIG. 8 is a diagram illustrating a structure of an electromagnetic wave reverberation chamber according to a third example embodiment.

Referring to FIG. 8, each of a column-type mode stirrer 801 and a ceiling-type mode stirrer 802 is formed by a combination of at least two panels. Here, a panel is provided as an example of an electromagnetic wave reflector. However, the column-type mode stirrer 801 and the ceiling-type mode stirrer 802 illustrated herein are formed by electromagnetic wave reflectors that are not limited to the panels. In detail, each of the column-type mode stirrer 801 and the ceiling-type mode stirrer 802 is formed in a flattened U shape by the combination of the at least two panels. However, a shape of a mode stirrer is not limited to the flattened U shape and various shapes including, for example, a reversed S shape and a square shape that may be formed with at least two panels, may be used.

Here, a size of a panel included in each of the column-type mode stirrer 801 and the ceiling-type mode stirrer 802 may be set to improve electromagnetic wave uniformity. In addition, a gap between the panels of each of the column-type mode stirrer 801 and the ceiling-type mode stirrer 802 may be set to increase an eigenmode shift in a limited space. It may be advantageous when the size of the panel is greater with respect to a wavelength of an LUF, and the size of the panel may have a minimum value of lambda/4.

In addition, performance of an electromagnetic wave reverberation chamber in which both a column-type mode stirrer and a ceiling-type mode stirrer are flattened U-shaped as illustrated in FIG. 8 may be improved in terms of electromagnetic wave uniformity, compared to performance of an electromagnetic wave reverberation chamber in which one of a column-type mode stirrer and a ceiling-type mode stirrer is flattened U-shaped as illustrated in FIG. 8.

Figure 9:
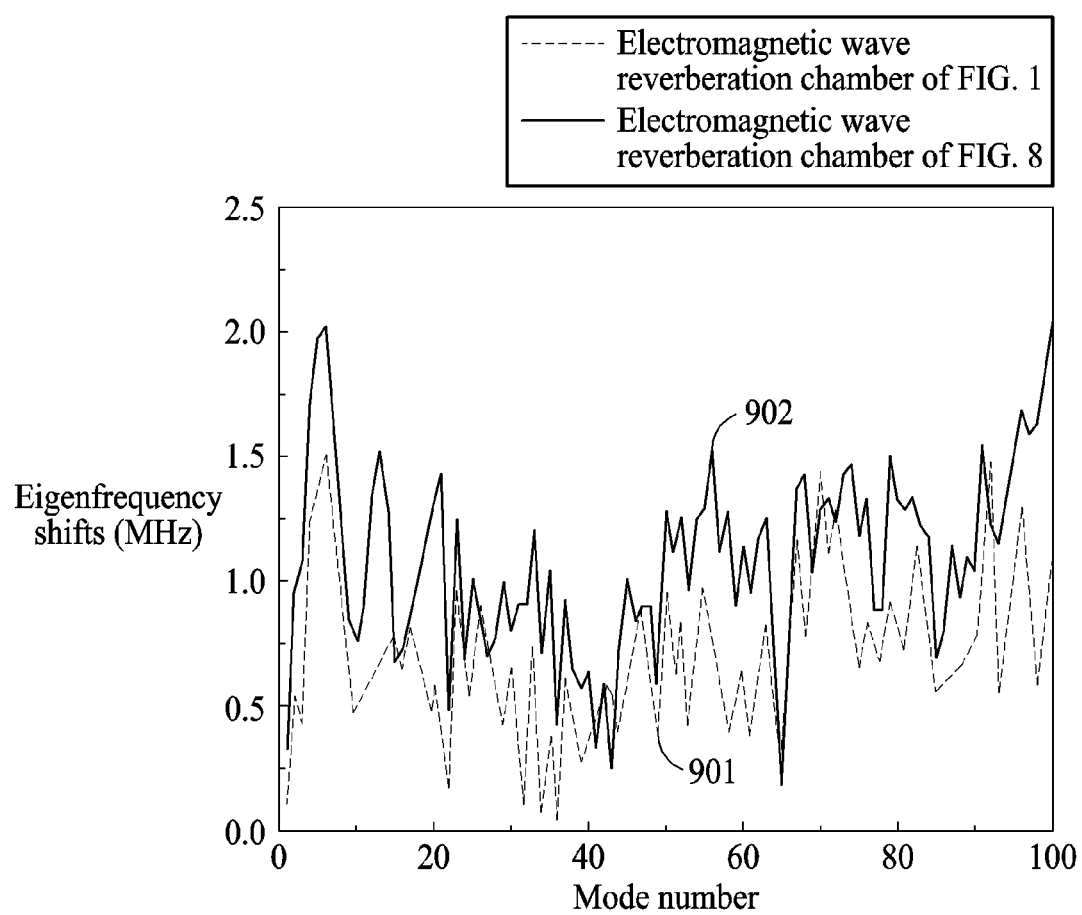
FIG. 9 is a diagram illustrating a comparison between eigenfrequency shifts calculated through a numerical analysis of the electromagnetic wave reverberation chamber illustrated in FIG. 8 according to the third example embodiment, and eigenfrequency shifts calculated through a numerical analysis of the electromagnetic wave reverberation chamber illustrated in FIG. 1.

FIG. 9 is a diagram illustrating a comparison between eigenfrequency shifts calculated through a numerical analysis of the electromagnetic wave reverberation chamber illustrated in FIG. 8 according to the third example embodiment, and eigenfrequency shifts calculated through a numerical analysis of the electromagnetic wave reverberation chamber 100 illustrated in FIG. 1.

In FIG. 9, the electromagnetic wave reverberation chamber 100 of FIG. 1 is illustrated as a target for a comparison to the electromagnetic wave reverberation chamber of FIG. 8 to indicate improved performance of the electromagnetic wave reverberation chamber of FIG. 8. A graph 901 illustrates eigenfrequency shifts of the electromagnetic wave reverberation chamber 100 illustrated in FIG. 1. That is, the graph 901 illustrates shifts in eigenfrequency shown in a case in which the electromagnetic wave reverberation chamber 100 includes therein the column-type mode stirrer 101 and the ceiling-type mode stirrer 102, compared to a case in which an electromagnetic wave reverberation chamber is empty.

A graph 902 illustrates eigenfrequency shifts of the electromagnetic wave reverberation chamber illustrated in FIG. 8. That is, the graph 902 illustrates shifts in eigenfrequency shown in a case in which the electromagnetic wave reverberation chamber includes therein the column-type mode stirrer 801, the ceiling-type mode stirrer 802, and the pyramidal mode stirrer 803, compared to the case in which the electromagnetic wave reverberation chamber is empty. Here, panels of each of the column-type mode stirrer 801 and the ceiling-type mode stirrer 802 are combined to be in a flattened U shape. A panel used herein is provided as an example of an electromagnetic wave reflector. However, the column-type mode stirrer 801 and the ceiling-type mode stirrer 802 including electromagnetic wave reflectors that are not limited to the panels may also be used. In addition, a shape of the combination of the panels is not limited to the flattened U shape and various shapes including, for example, a reversed S shape and a square shape, may be used.

That is, an eigenfrequency shift of the electromagnetic wave reverberation chamber illustrated in FIG. 8 may increase in most mode numbers, compared to an eigenfrequency shift of the electromagnetic wave reverberation chamber 100 illustrated in FIG. 1. Thus, improved electromagnetic wave uniformity is verified here.

Figure 10:
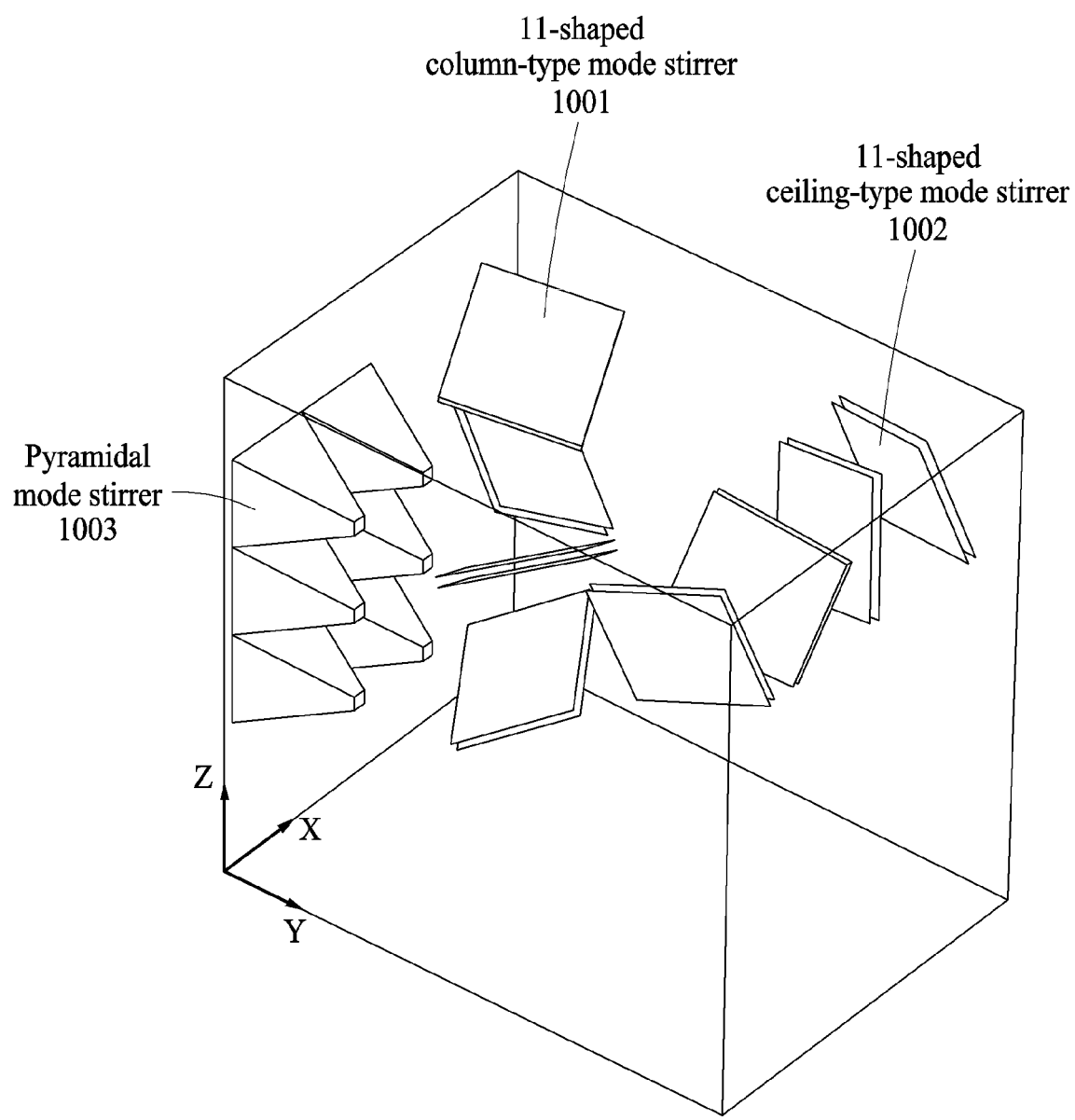
FIG. 10 is a diagram illustrating a structure of an electromagnetic wave reverberation chamber according to a fourth example embodiment.

FIG. 10 is a diagram illustrating a structure of an electromagnetic wave reverberation chamber according to a fourth example embodiment.

Referring to FIG. 10, each of a column-type mode stirrer 1001 and a ceiling-type mode stirrer 1002 is formed by a combination of at least two panels. A panel used herein is provided as an example of an electromagnetic wave reflector. However, the column-type mode stirrer 1001 and the ceiling-type mode stirrer 1002 illustrated herein are formed by electromagnetic wave reflectors that are not limited to the panels. In detail, each of the column-type mode stirrer 1001 and the ceiling-type mode stirrer 1002 is provided in an 11 shape in which two panels face each other.

A size of a panel included in each of the column-type mode stirrer 1001 and the ceiling-type mode stirrer 1002 may be set to improve electromagnetic wave uniformity. In addition, a gap between the panels of each of the column-type mode stirrer 1001 and the ceiling-type mode stirrer 1002 may be set to increase an eigenmode shift.

In addition, performance of an electromagnetic wave reverberation chamber in which both a column-type mode stirrer and a ceiling-type mode stirrer are 11-shaped as illustrated in FIG. 10 may be improved in terms of electromagnetic wave uniformity, compared to performance of an electromagnetic wave reverberation chamber in which one of a column-type mode stirrer and a ceiling-type mode stirrer is 11-shaped as illustrated in FIG. 10.

Figure 11:
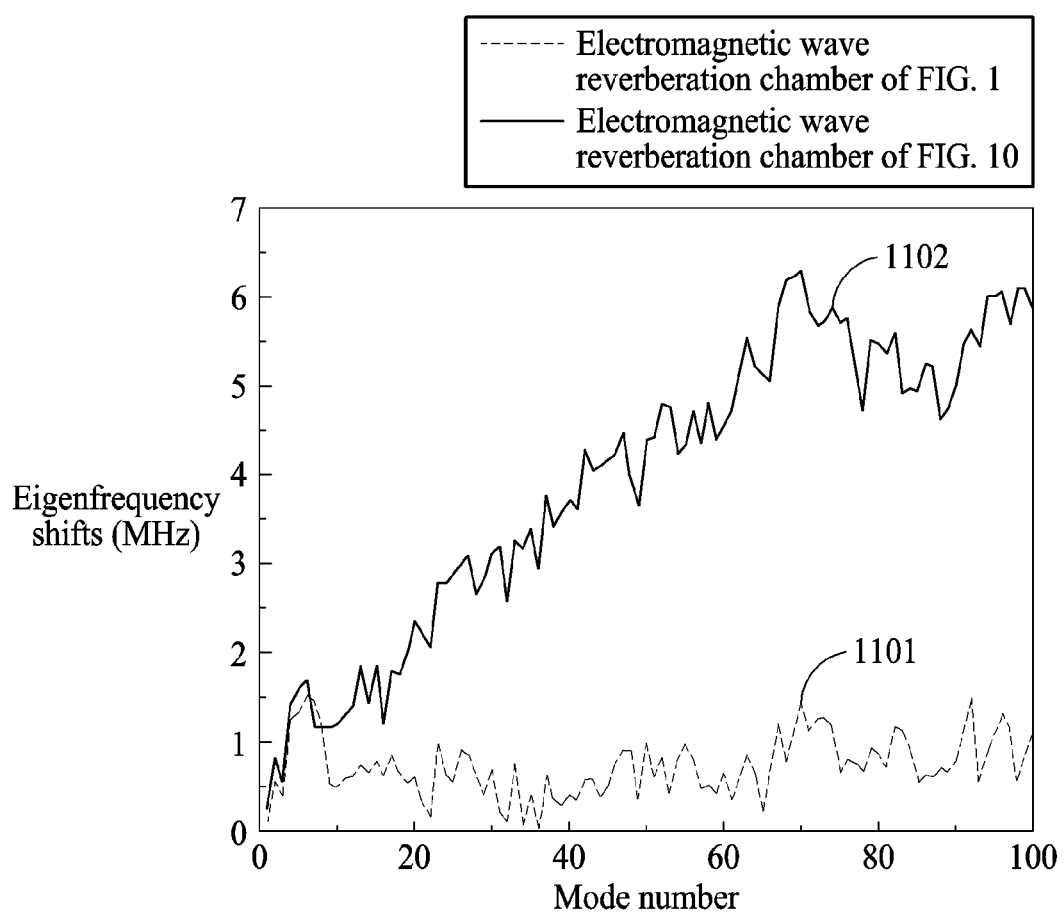
FIG. 11 is a diagram illustrating a comparison between eigenfrequency shifts calculated through a numerical analysis of the electromagnetic wave reverberation chamber illustrated in FIG. 10 according to the fourth example embodiment, and eigenfrequency shifts calculated through a numerical analysis of the electromagnetic wave reverberation chamber illustrated in FIG. 1.

FIG. 11 is a diagram illustrating a comparison between eigenfrequency shifts calculated through a numerical analysis of the electromagnetic wave reverberation chamber illustrated in FIG. 10 according to the fourth example embodiment, and eigenfrequency shifts calculated through a numerical analysis of the electromagnetic wave reverberation chamber 100 illustrated in FIG. 1.

In FIG. 11, the electromagnetic wave reverberation chamber 100 of FIG. 1 is illustrated as a target for a comparison to the electromagnetic wave reverberation chamber of FIG. 10 to indicate improved performance of the electromagnetic wave reverberation chamber of FIG. 10. A graph 1101 illustrates eigenfrequency shifts of the electromagnetic wave reverberation chamber 100 illustrated in FIG. 1. That is, the graph 1101 illustrates shifts in eigenfrequency shown in a case in which the electromagnetic wave reverberation chamber 100 includes therein the column-type mode stirrer 101 and the ceiling-type mode stirrer 102, compared to a case in which an electromagnetic wave reverberation chamber is empty.

A graph 1102 illustrates eigenfrequency shifts of the electromagnetic wave reverberation chamber illustrated in FIG. 10. That is, the graph 1102 illustrates shifts in eigenfrequency shown in a case in which the electromagnetic wave reverberation chamber includes therein the column-type mode stirrer 1001, the ceiling-type mode stirrer 1002, and the pyramidal mode stirrer 1003, compared to the case in which the electromagnetic wave reverberation chamber is empty. Here, panels of each of the column-type mode stirrer 1001 and the ceiling-type mode stirrer 1002 are combined to be in an 11 shape. A panel used herein is provided as an example of an electromagnetic wave reflector. However, the column-type mode stirrer 1001 and the ceiling-type mode stirrer 1002 including electromagnetic wave reflectors that are not limited to the panels may also be used. In addition, a shape of the combination of the panels is not limited to the 11 shape, and various shapes may also be used.

That is, an eigenfrequency shift of the electromagnetic wave reverberation chamber illustrated in FIG. 10 may increase in most mode numbers, compared to an eigenfrequency shift of the electromagnetic wave reverberation chamber 100 illustrated in FIG. 1. Thus, improved electromagnetic wave uniformity is verified here.

Figure 12:
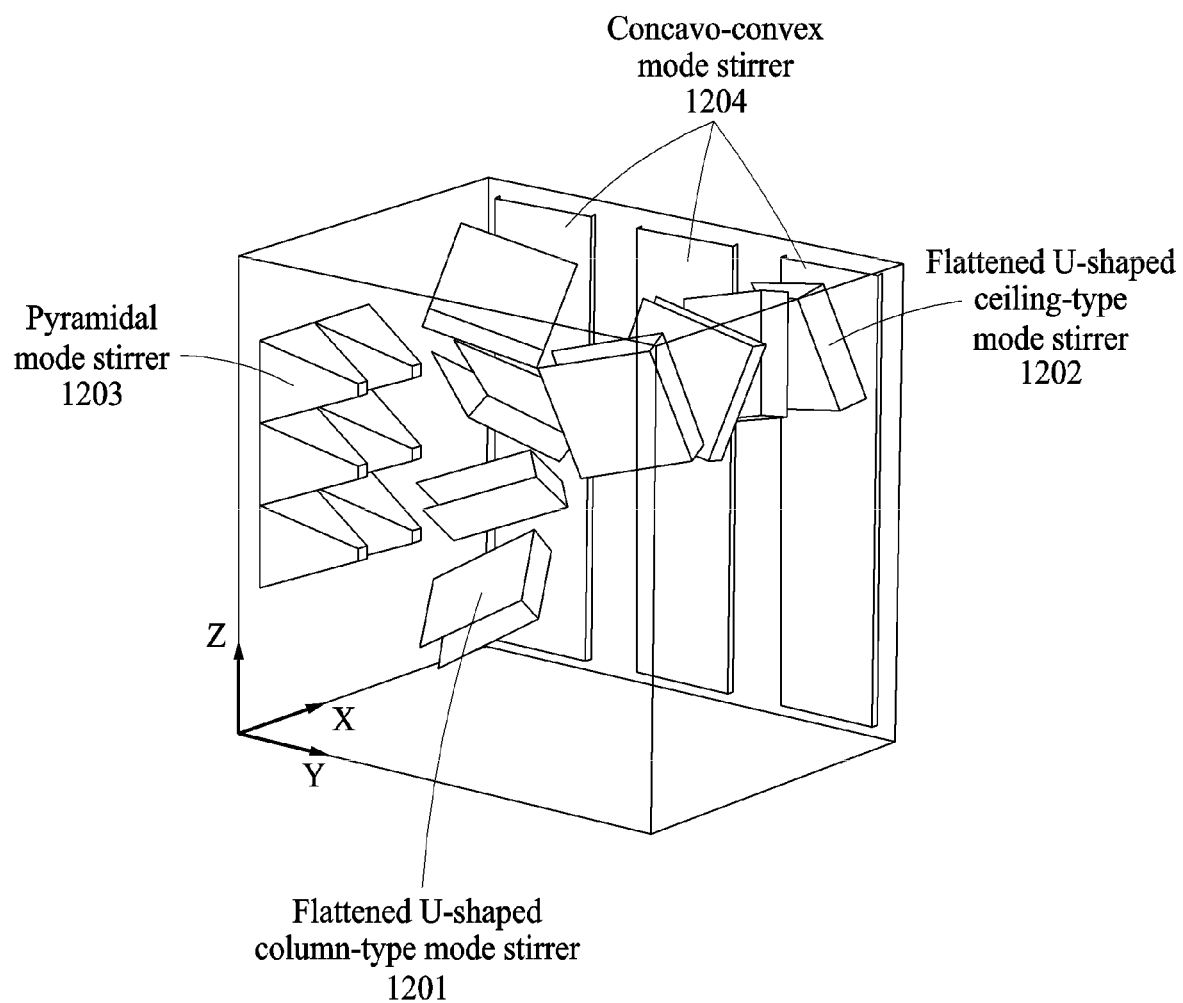
FIG. 12 is a diagram illustrating a structure of an electromagnetic wave reverberation chamber according to a fifth example embodiment.

FIG. 12 is a diagram illustrating a structure of an electromagnetic wave reverberation chamber according to a fifth example embodiment.

FIG. 12 illustrates a structure obtained by additionally installing a concavo-convex mode stirrer 1204 on one wall surface of the electromagnetic wave reverberation chamber illustrated in FIG. 8. The electromagnetic wave reverberation chamber illustrated in FIG. 8 includes the column-type mode stirrer 801 that is illustrated as a column-type mode stirrer 1201 in FIG. 12, the ceiling-type mode stirrer 802 that is illustrated as a ceiling-type mode stirrer 1202 in FIG. 12, and the pyramidal mode stirrer 803 that is illustrated as a pyramidal mode stirrer 1203 in FIG. 12, in which each of the column-type mode stirrer 801 and the ceiling-type mode stirrer 802 is formed by a combination of at least two panels. A panel used herein is provided as an example of an electromagnetic wave reflector. However, the column-type mode stirrer 1201 and the ceiling-type mode stirrer 1202 including electromagnetic wave reflectors that are not limited to the panels may also be used. Here, the column-type mode stirrer 1201 and the ceiling-type mode stirrer 1202 are flattened U-shaped.

That is, the electromagnetic wave reverberation chamber illustrated in FIG. 12 further includes the concavo-convex mode stirrer 1204 to increase an eigenfrequency shift and improve electromagnetic wave uniformity.

Figure 13:
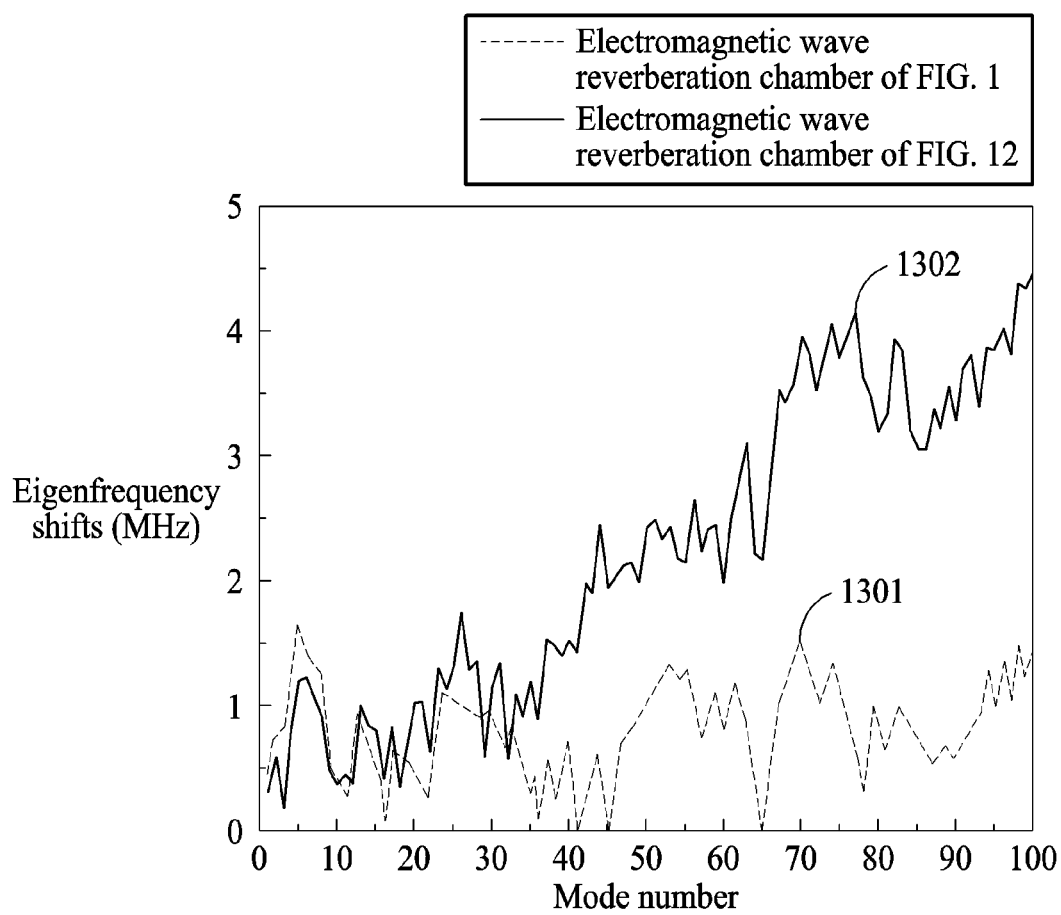
FIG. 13 is a diagram illustrating a comparison between eigenfrequency shifts calculated through a numerical analysis of the electromagnetic wave reverberation chamber illustrated in FIG. 12 according to the fifth example embodiment, and eigenfrequency shifts calculated through a numerical analysis of the electromagnetic wave reverberation chamber illustrated in FIG. 1.

FIG. 13 is a diagram illustrating a comparison between eigenfrequency shifts calculated through a numerical analysis of the electromagnetic wave reverberation chamber illustrated in FIG. 12 according to the fifth example embodiment, and eigenfrequency shifts calculated through a numerical analysis of the electromagnetic wave reverberation chamber 100 illustrated in FIG. 1.

In FIG. 13, the electromagnetic wave reverberation chamber 100 of FIG. 1 is illustrated as a target for a comparison to the electromagnetic wave reverberation chamber of FIG. 12 to indicate improved performance of the electromagnetic wave reverberation chamber of FIG. 12. A graph 1301 illustrates eigenfrequency shifts of the electromagnetic wave reverberation chamber 100 illustrated in FIG. 1. That is, the graph 1301 illustrates shifts in eigenfrequency shown in a case in which the electromagnetic wave reverberation chamber 100 includes therein the column-type mode stirrer 101 and the ceiling-type mode stirrer 102, compared to a case in which an electromagnetic wave reverberation chamber is empty.

A graph 1302 illustrates eigenfrequency shifts of the electromagnetic wave reverberation chamber illustrated in FIG. 12. That is, the graph 1302 illustrates shifts in eigenfrequency shown in a case in which the electromagnetic wave reverberation chamber includes therein the column-type mode stirrer 1201, the ceiling-type mode stirrer 1202, the pyramidal mode stirrer 1203, and the concavo-convex mode stirrer 1204, compared to the case in which the electromagnetic wave reverberation chamber is empty. Here, panels of each of the column-type mode stirrer 1201 and the ceiling-type mode stirrer 1202 are combined to be in a flattened U shape. However, a shape of the combination of the panels is not limited to the flattened U shape and various shapes including, for example, a reversed S shape and a square shape, may also be used. A panel used herein is provided as an example of an electromagnetic wave reflector. However, the column-type mode stirrer 1201 and the ceiling-type mode stirrer 1202 including electromagnetic wave reflectors that are not limited to the panels may also be used.

That is, an eigenfrequency shift of the electromagnetic wave reverberation chamber illustrated in FIG. 12 may increase in most mode numbers, compared to an eigenfrequency shift of the electromagnetic wave reverberation chamber 100 illustrated in FIG. 1. Thus, improved electromagnetic wave uniformity is verified here.

Figure 14:
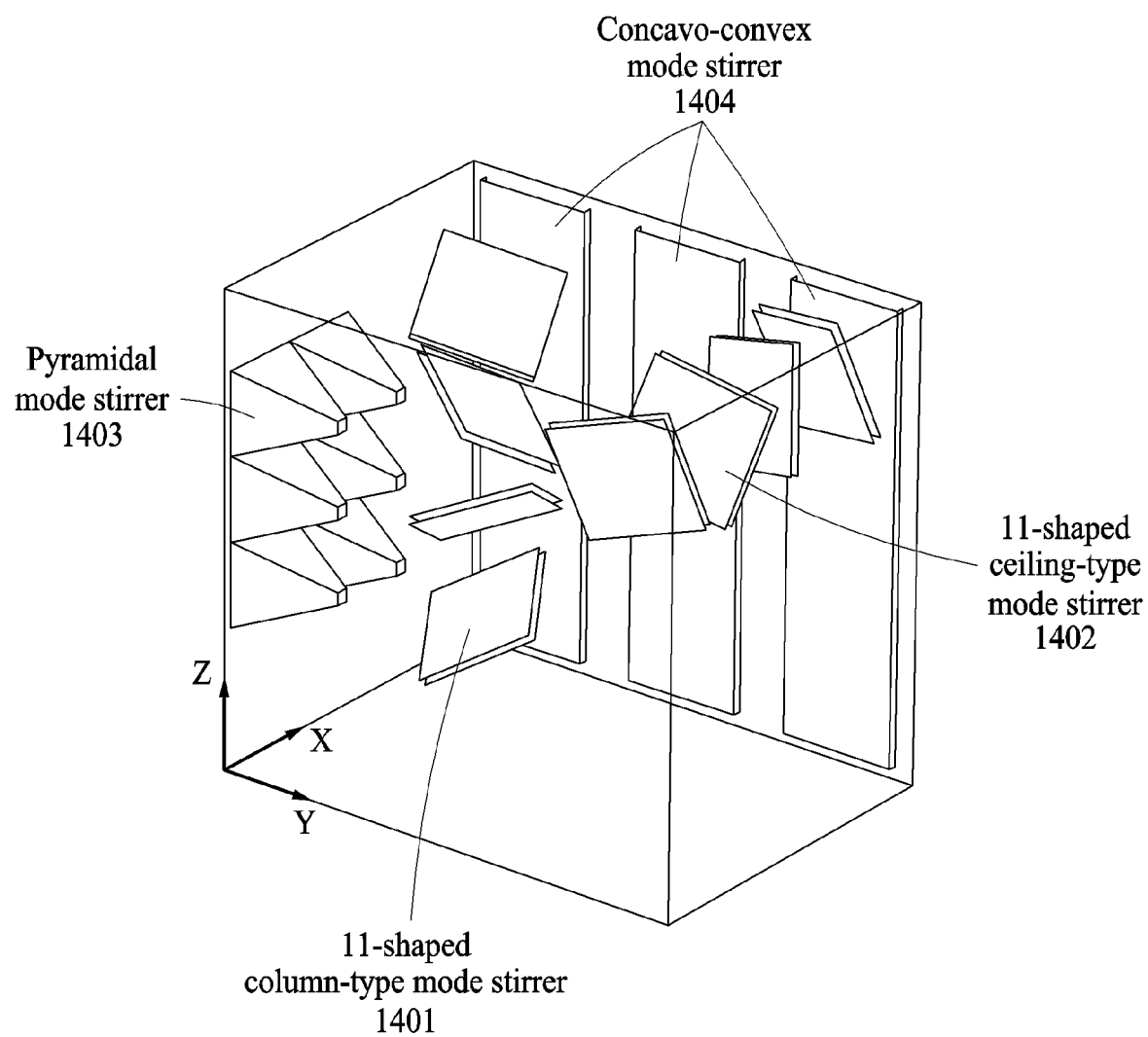
FIG. 14 is a diagram illustrating a structure of an electromagnetic wave reverberation chamber according to a sixth example embodiment.

FIG. 14 is a diagram illustrating a structure of an electromagnetic wave reverberation chamber according to a sixth example embodiment.

FIG. 14 illustrates a structure obtained by additionally installing a concavo-convex mode stirrer 1404 on one wall surface of the electromagnetic wave reverberation chamber illustrated in FIG. 10. The electromagnetic wave reverberation chamber illustrated in FIG. 10 includes the column-type mode stirrer 1001 that is illustrated as a column-type mode stirrer 1401 in FIG. 4, the ceiling-type mode stirrer 1002 that is illustrated as a ceiling-type mode stirrer 1402 in FIG. 4, and the pyramidal mode stirrer 1003 that is illustrated as a pyramidal mode stirrer 1403 in FIG. 4, in which each of the column-type mode stirrer 1001 and the ceiling-type mode stirrer 1002 is formed by a combination of at least two panels. A panel used herein is provided as an example of an electromagnetic wave reflector. However, the column-type mode stirrer 1401 and the ceiling-type mode stirrer 1402 including electromagnetic wave reflectors that are not limited to the panels may also be used. Here, the column-type mode stirrer 1401 and the ceiling-type mode stirrer 1402 are 11-shaped. However, a shape of each of the column-type mode stirrer 1401 and the ceiling-type mode stirrer 1402 is not limited to an 11 shape as illustrated, and various shapes may also be used.

That is, the electromagnetic wave reverberation chamber illustrated in FIG. 14 further includes the concavo-convex mode stirrer 1404 to increase an eigenfrequency shift and improve electromagnetic wave uniformity.

Figure 15:
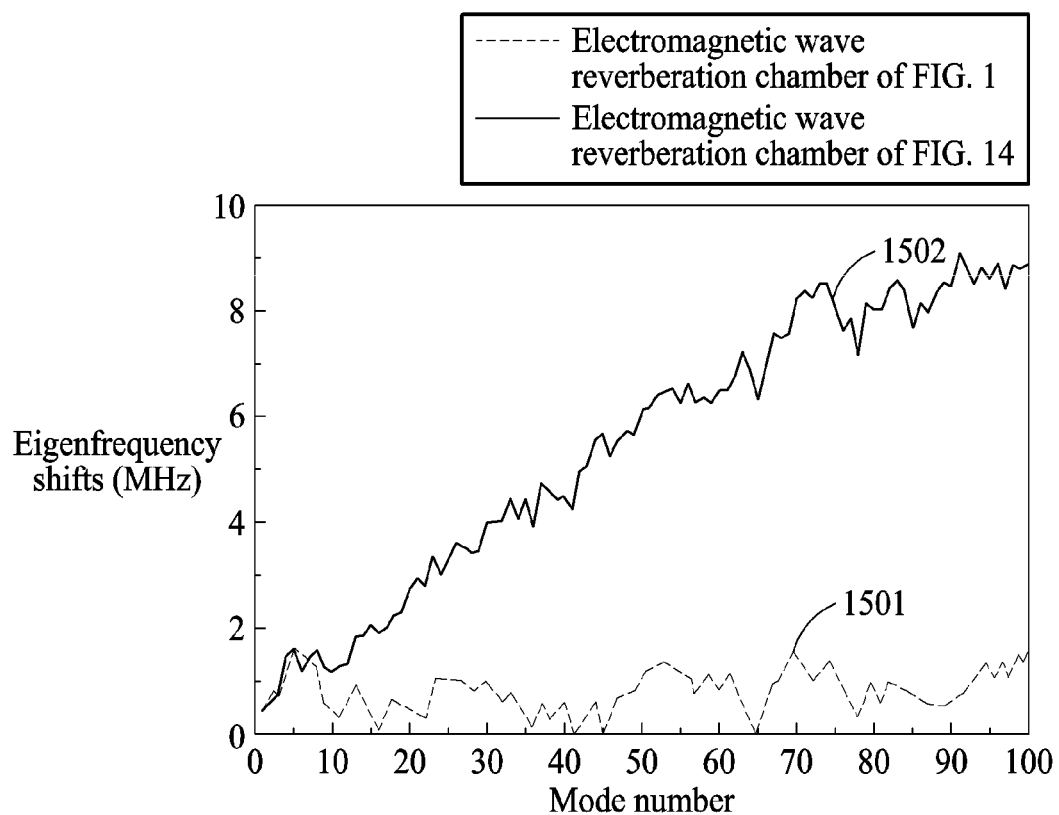
FIG. 15 is a diagram illustrating a comparison between eigenfrequency shifts calculated through a numerical analysis of the electromagnetic wave reverberation chamber illustrated in FIG. 14 according to the sixth example embodiment, and eigenfrequency shifts calculated through a numerical analysis of the electromagnetic wave reverberation chamber illustrated in FIG. 1.

FIG. 15 is a diagram illustrating a comparison between eigenfrequency shifts calculated through a numerical analysis of the electromagnetic wave reverberation chamber illustrated in FIG. 14 according to the sixth example embodiment, and eigenfrequency shifts calculated through a numerical analysis of the electromagnetic wave reverberation chamber 100 illustrated in FIG. 1.

In FIG. 15, the electromagnetic wave reverberation chamber 100 of FIG. 1 is illustrated as a target for a comparison to the electromagnetic wave reverberation chamber of FIG. 14 to indicate improved performance of the electromagnetic wave reverberation chamber of FIG. 14. A graph 1501 illustrates eigenfrequency shifts of the electromagnetic wave reverberation chamber 100 illustrated in FIG. 1. That is, the graph 1501 illustrates shifts in eigenfrequency shown in a case in which the electromagnetic wave reverberation chamber 100 includes therein the column-type mode stirrer 101 and the ceiling-type mode stirrer 102, compared to a case in which an electromagnetic wave reverberation chamber is empty.

A graph 1502 illustrates eigenfrequency shifts of the electromagnetic wave reverberation chamber illustrated in FIG. 14. That is, the graph 1502 illustrates shifts in eigenfrequency shown in a case in which the electromagnetic wave reverberation chamber includes therein the column-type mode stirrer 1401, the ceiling-type mode stirrer 1402, the pyramidal mode stirrer 1403, and the concavo-convex mode stirrer 1404, compared to the case in which the electromagnetic wave reverberation chamber is empty.

Here, panels of each of the column-type mode stirrer 1401 and the ceiling-type mode stirrer 1402 are combined to be in an 11 shape, as a detailed example. A panel used herein is provided as an example of an electromagnetic wave reflector. However, the column-type mode stirrer 1401 and the ceiling-type mode stirrer 1402 including electromagnetic wave reflectors that are not limited to the panels may also be used. However, a shape of the combination of the panels is not limited to the 11 shape and various shapes including, for example, a reversed S shape and a square shape, may also be used.

That is, an eigenfrequency shift of the electromagnetic wave reverberation chamber illustrated in FIG. 14 may increase in most mode numbers, compared to an eigenfrequency shift of the electromagnetic wave reverberation chamber 100 illustrated in FIG. 1. Thus, improved electromagnetic wave uniformity is verified here.

Figure 16:
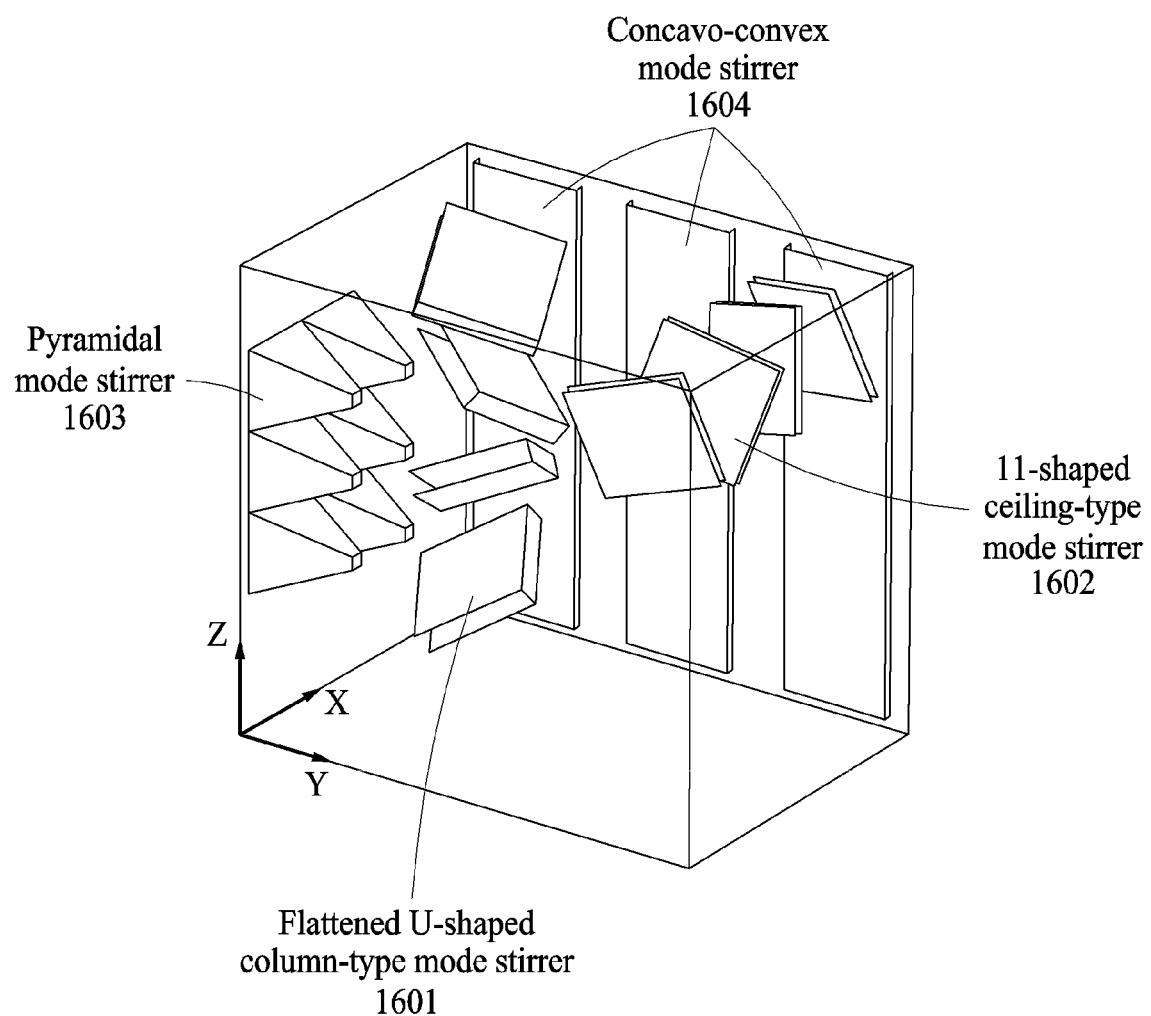
FIG. 16 is a diagram illustrating a structure of an electromagnetic wave reverberation chamber according to a seventh example embodiment.

FIG. 16 is a diagram illustrating a structure of an electromagnetic wave reverberation chamber according to a seventh example embodiment.

FIG. 16 illustrates a structure obtained by additionally installing a concavo-convex mode stirrer 1604 on one wall surface of the electromagnetic wave reverberation chamber illustrated in FIG. 10. The electromagnetic wave reverberation chamber illustrated in FIG. 10 includes the column-type mode stirrer 1001 that is illustrated as a column-type mode stirrer 1601 in FIG. 16, the ceiling-type mode stirrer 1002 that is illustrated as a ceiling-type mode stirrer 1602 in FIG. 16, and the pyramidal mode stirrer 1003 that is illustrated in a pyramidal mode stirrer 1603 in FIG. 16, in which each of the column-type mode stirrer 1001 and the ceiling-type mode stirrer 1002 is formed by a combination of at least two panels.

Here, as illustrated, the column-type mode stirrer 1601 and the ceiling-type mode stirrer 1602 are flattened U-shaped and 11-shaped, respectively. A panel used herein is provided as an example of an electromagnetic wave reflector. However, the column-type mode stirrer 1601 and the ceiling-type mode stirrer 1602 including electromagnetic wave reflectors that are not limited to the panels may also be used. That is, as illustrated, the panels of the column-type mode stirrer 1601 are arranged in a flattened U shape, whereas the panels of the ceiling-type mode stirrer 1602 are arranged in an 11 shape. Alternatively, the panels of the column-type mode stirrer 1601 are arranged in the 11 shape, whereas the panels of the ceiling-type mode stirrer 1602 are arranged in the flattened U shape. However, a shape of each of the column-type mode stirrer 1601 and the ceiling-type mode stirrer 1602 is not limited to the flattened U shape and the 11 shape, and various shapes may also be used.

Figure 17:
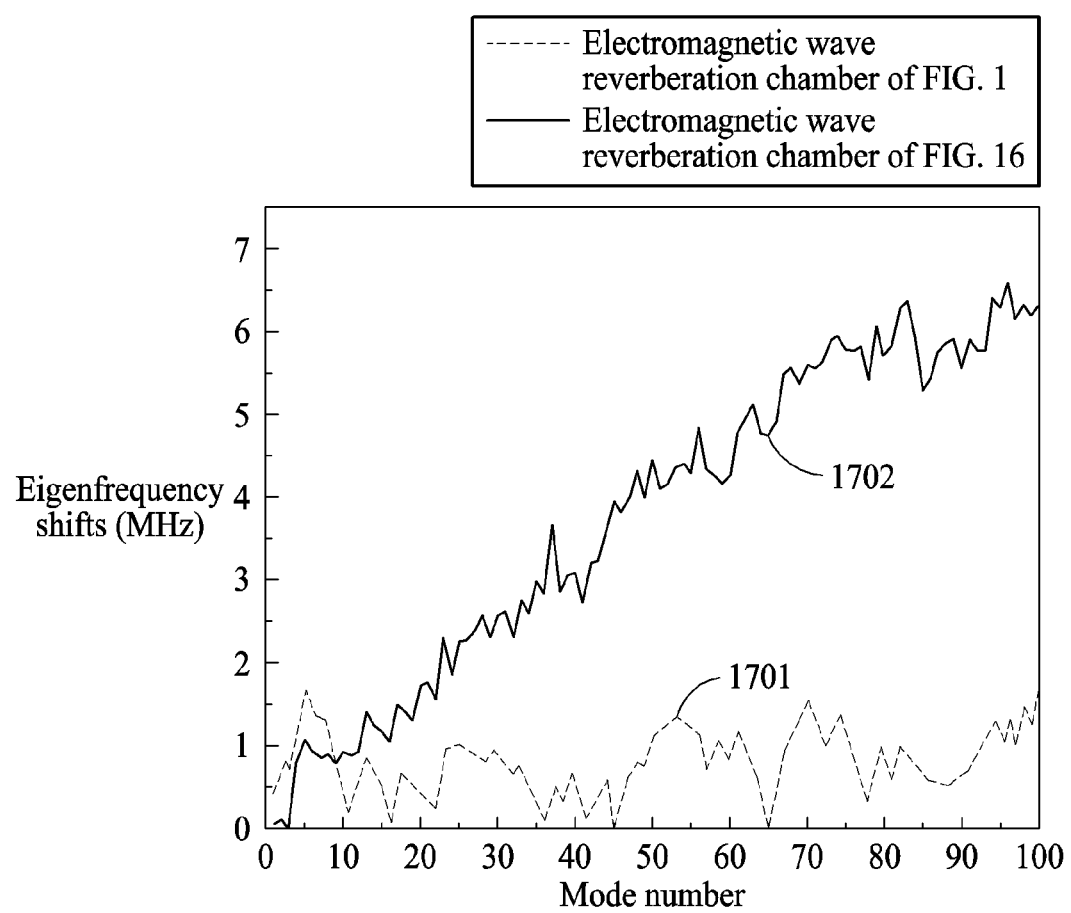
FIG. 17 is a diagram illustrating a comparison between eigenfrequency shifts calculated through a numerical analysis of the electromagnetic wave reverberation chamber illustrated in FIG. 16 according to the seventh example embodiment, and eigenfrequency shifts calculated through a numerical analysis of the electromagnetic wave reverberation chamber illustrated in FIG. 1.

FIG. 17 is a diagram illustrating a comparison between eigenfrequency shifts calculated through a numerical analysis of the electromagnetic wave reverberation chamber illustrated in FIG. 16 according to the seventh example embodiment, and eigenfrequency shifts calculated through a numerical analysis of the electromagnetic wave reverberation chamber 100 illustrated in FIG. 1.

In FIG. 17, the electromagnetic wave reverberation chamber 100 of FIG. 1 is illustrated as a target for a comparison to the electromagnetic wave reverberation chamber of FIG. 16 to indicate improved performance of the electromagnetic wave reverberation chamber of FIG. 16. A graph 1701 illustrates eigenfrequency shifts of the electromagnetic wave reverberation chamber 100 illustrated in FIG. 1. That is, the graph 1701 illustrates shifts in eigenfrequency shown in a case in which the electromagnetic wave reverberation chamber 100 includes therein the column-type mode stirrer 101 and the ceiling-type mode stirrer 102, compared to a case in which an electromagnetic wave reverberation chamber is empty.

A graph 1702 illustrates eigenfrequency shifts of the electromagnetic wave reverberation chamber illustrated in FIG. 16. That is, the graph 1702 illustrates shifts in eigenfrequency shown in a case in which the electromagnetic wave reverberation chamber includes therein the column-type mode stirrer 1601, the ceiling-type mode stirrer 1602, the pyramidal mode stirrer 1603, and the concavo-convex mode stirrer 1604, compared to the case in which the electromagnetic wave reverberation chamber is empty. Here, panels of each of the column-type mode stirrer 1601 and the ceiling-type mode stirrer 1602 are combined to be in a flattened U shape and an 11 shape, respectively, as a detailed example. A panel used herein is provided as an example of an electromagnetic wave reflector. However, the column-type mode stirrer 1601 and the ceiling-type mode stirrer 1602 including electromagnetic wave reflectors that are not limited to the panels may also be used.

That is, an eigenfrequency shift of the electromagnetic wave reverberation chamber illustrated in FIG. 16 may increase in most mode numbers, compared to an eigenfrequency shift of the electromagnetic wave reverberation chamber 100 illustrated in FIG. 1. Thus, improved electromagnetic wave uniformity is verified here.

While the present disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An electromagnetic wave reverberation chamber, comprising:
   a column-type mode stirrer including a plurality of plate-shaped electromagnetic wave reflectors connected by a metal column provided on a bottom of the electromagnetic wave reverberation chamber;
   a ceiling-type mode stirrer including a plurality of plate-shaped electromagnetic wave reflectors connected by a metal column provided on a wall surface of the electromagnetic wave reverberation chamber, and disposed around a ceiling of the electromagnetic wave reverberation chamber;
   a pyramidal mode stirrer including a plurality of pyramid-shaped electromagnetic wave reflectors and disposed on a wall surface of the electromagnetic wave reverberation chamber, and
   a concavo-convex mode stirrer including an electromagnetic wave reflector disposed in a concavo-convex form, and disposed on another wall surface different from the wall surface on which the pyramidal mode stirrer is disposed, wherein the concavo-convex mode stirrer is provided as a plurality of concavo-convex mode stirrers disposed parallel to the wall surface, each concavo-convex mode stirrer having a width parallel to the wall surface greater than a height extending from the wall surface, and wherein each of the column-type mode stirrer and the ceiling-type mode stirrer is formed by a combination of at least two panels.

2. The electromagnetic wave reverberation chamber of claim 1, wherein an eigenmode of the electromagnetic wave reverberation chamber is changed by the column-type mode stirrer, the ceiling-type mode stirrer, and the pyramidal mode stirrer.

3. The electromagnetic wave reverberation chamber of claim 1, wherein an eigenmode of the electromagnetic wave reverberation chamber is changed by adjusting a width, a length, and a height of the concavo-convex mode stirrer, and a number of concavo-convex mode stirrers.

4. The electromagnetic wave reverberation chamber of claim 1, wherein the plurality of plate-shaped electromagnetic wave reflectors of each of the column-type mode stirrer and the ceiling-type mode stirrer are combined to form a preset shape.

5. The electromagnetic wave reverberation chamber of claim 4, wherein a size of each of the plurality of plate-shaped electromagnetic wave reflectors is determined to be a preset value.

6. The electromagnetic wave reverberation chamber of claim 4, wherein a gap between the plurality of plate-shaped electromagnetic wave reflectors is determined to be a preset value.

\* \* \* \* \*